United States Patent
Matsushita et al.

(10) Patent No.: US 11,937,447 B2
(45) Date of Patent: Mar. 19, 2024

(54) OPTICAL FILM AND IMAGE DISPLAY DEVICE

(71) Applicant: DAI NIPPON PRINTING CO., LTD., Tokyo (JP)

(72) Inventors: Hiroki Matsushita, Tokyo (JP); Yoshimasa Ogawa, Tokyo (JP); Yousuke Kousaka, Tokyo (JP); Jun Sato, Tokyo (JP); Keisuke Ebisu, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 17/747,609

(22) Filed: May 18, 2022

(65) Prior Publication Data
US 2022/0285648 A1    Sep. 8, 2022

Related U.S. Application Data

(63) Continuation of application No. 16/651,226, filed as application No. PCT/JP2018/036603 on Sep. 28, 2018, now Pat. No. 11,367,856.

(30) Foreign Application Priority Data

Sep. 29, 2017  (JP) ................................. 2017-191319

(51) Int. Cl.
*H10K 50/844* (2023.01)
*G02B 1/14* (2015.01)
(Continued)

(52) U.S. Cl.
CPC ............. *H10K 50/844* (2023.02); *G02B 1/14* (2015.01); *H10K 50/86* (2023.02); *H10K 59/12* (2023.02); *H10K 59/40* (2023.02)

(58) Field of Classification Search
CPC ...... H10K 50/844; H10K 50/86; H10K 59/12; H10K 59/40; G02B 1/14
See application file for complete search history.

(56) References Cited

U.S. PATENT DOCUMENTS

| | | | | |
|---|---|---|---|---|
| 11,367,856 B2 * | 6/2022 | Matsushita | ............. | B32B 27/20 |
| 2014/0247486 A1 * | 9/2014 | Shibata | ................... | G02B 1/14 |
| | | | | 977/773 |

(Continued)

FOREIGN PATENT DOCUMENTS

| | | |
|---|---|---|
| CN | 103492912 | 1/2014 |
| CN | 104380394 | 2/2015 |

(Continued)

OTHER PUBLICATIONS

Reconsideration Report, issued in the corresponding Japanese patent application No. 2019-545206, dated Jan. 30, 2023, 8 pages (with translation).

(Continued)

*Primary Examiner* — Nduka E Ojeh
(74) *Attorney, Agent, or Firm* — Hamre, Schumann, Mueller & Larson, P.C.

(57) ABSTRACT

An embodiment of the present invention provides an optical film (10) including a light-transmitting base material (11), a hard coat layer (12), and an inorganic layer (13) in this order, wherein the hard coat layer (12) is in contact with the inorganic layer (13), the hard coat layer (12) contains a binder resin (12A) and inorganic particles (12B), the hard coat layer (12) has a film thickness of 1 μm or more, and the hard coat layer (12) has an indentation hardness of 200 MPa or more.

24 Claims, 4 Drawing Sheets

(51) Int. Cl.
    *H10K 50/86*    (2023.01)
    *H10K 59/12*    (2023.01)
    *H10K 59/40*    (2023.01)

(56) References Cited

U.S. PATENT DOCUMENTS

| | | | | |
|---|---|---|---|---|
| 2015/0302951 | A1* | 10/2015 | Jung | G06F 3/041 |
| | | | | 428/216 |
| 2016/0185926 | A1* | 6/2016 | Song | C08J 7/0427 |
| | | | | 428/447 |
| 2017/0156227 | A1* | 6/2017 | Heo | H05K 5/0017 |
| 2017/0276840 | A1* | 9/2017 | Horio | B32B 3/30 |
| 2018/0201000 | A1 | 7/2018 | Kim et al. | |
| 2018/0370207 | A1 | 12/2018 | Nodono et al. | |
| 2021/0050553 | A1 | 2/2021 | Ogawa et al. | |

FOREIGN PATENT DOCUMENTS

| | | |
|---|---|---|
| JP | 10-232301 | 9/1998 |
| JP | 2008-165040 | 7/2008 |
| JP | 2009-132091 | 6/2009 |
| JP | 2009-286035 | 12/2009 |
| JP | 2010-000739 | 1/2010 |
| JP | 2010-069702 | 4/2010 |
| JP | 2013-142772 | 7/2013 |
| JP | 2014-041249 | 3/2014 |
| JP | 2014-206707 | 10/2014 |
| JP | 5870223 B1 | 2/2016 |
| JP | 2016-128927 | 7/2016 |
| WO | 2017/014198 | 1/2017 |
| WO | 2017/014287 | 1/2017 |
| WO | 2017/023117 | 2/2017 |

OTHER PUBLICATIONS

International Search Report, issued in the corresponding PCT Application No. PCT/JP2018/036603, dated Jan. 8, 2019, 5 pages.
International Preliminary Report on Patentability, issued in the corresponding PCT Application No. PCT/JP2018/036603, dated Mar. 31, 2020, 20 pages.

* cited by examiner

OPTICAL FILM AND IMAGE DISPLAY DEVICE

CROSS-REFERENCE TO RELATED APPLICATION

The present application enjoys the benefit of priority to the prior Japanese Patent Application No. 2017-191319 (filed on Sep. 29, 2017), the entire disclosure of which is incorporated herein by reference.

TECHNICAL FIELD

The present invention relates to an optical film and image display device.

BACKGROUND ART

Optical films are conventionally used for image display devices such as smartphones and tablet terminals. Examples of optical films to be used include optical films having a light-transmitting base material, a hard coat layer, and an inorganic layer in this order (see, for example, Patent Literature 1).

CITATION LIST

Patent Literature

Patent Literature 1: Japanese Patent Application Publication No. 2016-128927

SUMMARY OF THE INVENTION

In some cases, however, such an optical film having an inorganic layer will have the inorganic layer rubbed in a steel wool test in which the surface of the inorganic layer is rubbed with steel wool with a grade of #0000 by reciprocating the steel wool with a load of 1 kg/cm$^2$ for 10 times. In some other cases, the hard coat layer is chipped as well as the inorganic layer is scratched.

The present invention is designed to solve the above problems. That is, an object of the present invention is to provide an optical film having excellent scratch resistance and an image display device including the optical film.

The present invention includes the following inventions.

[1] An optical film including a hard coat layer and an inorganic layer in this order, wherein the hard coat layer is in contact with the inorganic layer, the hard coat layer contains a binder resin and inorganic particles, the hard coat layer has a film thickness of 1 μm or more, and the hard coat layer has an indentation hardness of 200 MPa or more.

[2] The optical film according to [1], wherein the inorganic particles have an area ratio of 5% or more and 75% or less in the region up to a depth of 500 nm into the hard coat layer from the interface between the hard coat layer and the inorganic layer in the cross-section of the hard coat layer in the film thickness direction.

[3] The optical film according to [1] or [2], wherein the inorganic particles are silica particles.

[4] An optical film including a light-transmitting base material, a hard coat layer, and an inorganic layer in this order, wherein the hard coat layer is in contact with the inorganic layer, the hard coat layer contains at least one of a metallic element and a metalloid element, the hard coat layer has a film thickness of 1 μm or more, and the hard coat layer has an indentation hardness of 200 MPa or more.

[5] The optical film according to any one of [1] to [4], wherein the inorganic layer is an inorganic oxide layer.

[6] The optical film according to any one of [1] to [4], wherein the inorganic layer contains silicon.

[7] The optical film according to any one of [1] to [6], wherein the inorganic layer has a thickness of 10 nm or more and 300 nm or less.

[8] The optical film according to any one of [4] to [7], wherein the hard coat layer contains a metalloid element, and the metalloid element is silicon.

[9] The optical film according to any one of [4] to [8], wherein the atomic ratio of the total of the metallic element and the metalloid element contained in the hard coat layer is 1.5% or more and 30% or less as measured by X-ray photoelectron spectroscopy.

[10] The optical film according to any one of [1] to [9], wherein the hard coat layer contains a polymer of a polymerizable compound containing a silsesquioxane having a polymerizable functional group.

[11] The optical film according to any one of [1] or [10], wherein no crack or break is formed in the optical film after folding the optical film at an angle of 180 degrees in a manner that leaves a gap of 6 mm between the opposite edges, unfolding the folded optical film, and repeating the process one hundred thousand times.

[12] The optical film according to any one of [1] or [11], wherein no crack or break is formed in the optical film after folding the optical film with the inorganic layer facing inward at an angle of 180 degrees in a manner that leaves a gap of 2 mm between the opposite edges, unfolding the folded optical film, and repeating the process one hundred thousand times.

[13] The optical film according to any one of [1] to [12], wherein the light-transmitting base material is composed of a polyimide resin, a polyamide resin, or a combination thereof.

[14] An image display device including a display panel and the optical film according to any one of [1] to [13] placed on the observer's side of the display panel, wherein the hard coat layer of the optical film is placed on the observer's side of the light-transmitting base material.

[15] The image display device according to [14], wherein the display panel is an organic light emitting diode panel.

According to one aspect and another aspect of the present invention, an optical film having excellent scratch resistance can be provided. According to still another aspect of the present invention, an image display device including such an optical film can be provided.

DESCRIPTION OF EMBODIMENTS

First Embodiment

An optical film and an image display device according to the first embodiment of the present invention are now described below with reference to the drawings. In this specification, the terms "film" and "sheet" are not distinguished from each other on the basis of the difference of names alone. For example, the term "film" is thus used to refer inclusively to a member called "sheet." FIG. 1 depicts a schematic diagram of the optical film according to the present embodiment, FIG. 2 depicts an enlarged view of a part of the optical film shown in FIG. 1, and FIGS. 3(A) to 3(C) schematically illustrate each step of the folding test.

Figure 1:
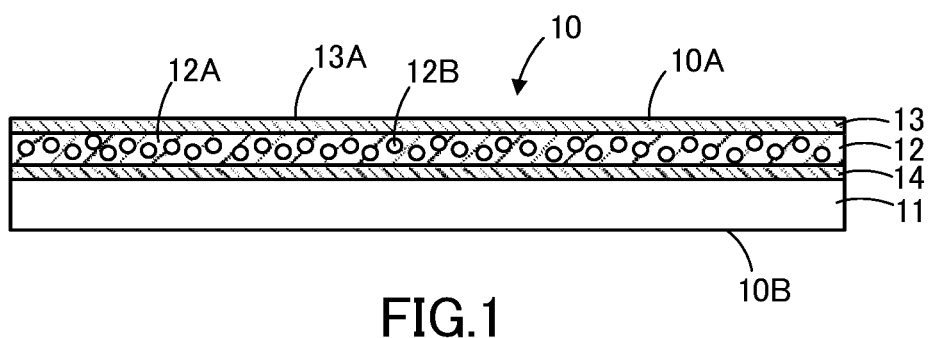
FIG. 1 depicts the schematic diagram of an optical film according to the first embodiment.
Figure 2:
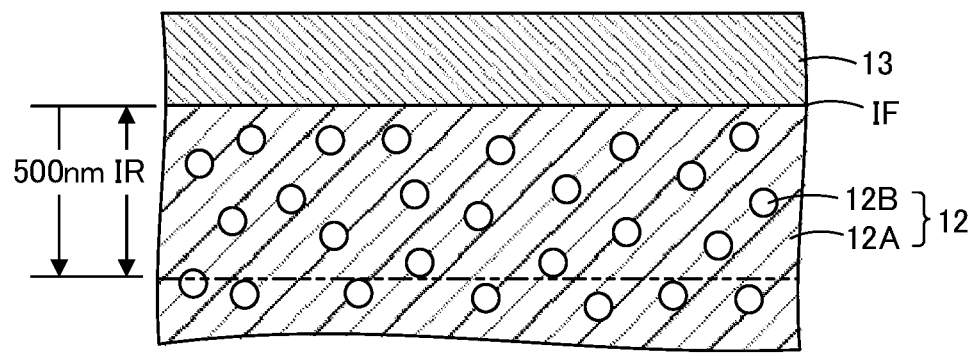
FIG. 2 depicts an enlarged view of a part of the optical film shown in FIG. 1.

The optical film 10 shown in FIG. 1 includes a light-transmitting base material 11, a hard coat layer 12, and an inorganic layer 13 in this order. The hard coat layer 12 is in contact with the inorganic layer 13. The optical film 10 further includes a functional layer 14 between the light-transmitting base material 11 and the hard coat layer 12. The optical film 10 shown in FIG. 1 includes a functional layer 14, but another optical film optionally includes no functional layer.

In FIG. 1, the surface 10A of the optical film 10 corresponds to the surface 13A of the inorganic layer 13. In this specification, the surface of the optical film is used to refer to one surface of the optical film. Thus, the surface opposite to the surface of the optical film will be referred to as the back surface, distinguished from the surface of the optical film. The back surface 10B of the optical film 10 corresponds to the opposite surface of the light-transmitting base material 11 from the hard coat layer 12 side.

The optical film 10 preferably has a haze value (total haze value) of 2.5% or less. The optical film 10 having a haze value of 2.5% or less can obtain excellent transparency. A haze value of 1.5% or less or 1.0% or less is preferable increasingly in this order (the smaller the value, the more preferable).

The above-described haze value can be measured using a haze meter (product name "HM-150"; manufactured by Murakami Color Research Laboratory Co., Ltd.) in accordance with JIS K7136: 2000. The above-described haze value is defined as the arithmetic mean of three haze values, wherein the three haze values are obtained by cutting a piece of 50 mm×100 mm from one optical film and placing the piece of film without any curl or wrinkle and without any fingerprint or dirt, into the haze meter in such a manner that the inorganic layer side faces opposite to the light source to measure the haze value, and repeating the measurement three times. The phrase "measured three times" as used herein should refer not to measuring at the same position three times but to measuring at three different positions. In the optical film 10, not only the surface 10A but also a laminated layer such as the hard coat layer 12 is visually observed to be flat and also has a deviation in film thickness within ±10%. Accordingly, it is considered that an approximate average haze value of the whole optical film can be obtained by measuring the haze value at three different positions on the piece cut out from the optical film. The deviation in haze value is within ±10% even if a measurement object has a size as large as 1 m×3000 m or has the same size as a 5-inch smartphone. If a piece having the same size as described above cannot be cut out from the optical film, a piece having a sample size of 21 mm or more in diameter is required because, for example, the HM-150 haze meter has an entrance port aperture having a diameter of 20 mm for use in the measurement. Thus, a piece having a size of 22 mm×22 mm or larger may be cut out from the optical film as appropriate. If the optical film is small in size, the optical film is gradually shifted or turned in such an extent that the light source spot is within the piece of film to secure three measurement positions. In cases where the optical film is in roll form, the optical film has an effective portion, which is a portion used for a product (for example, an image display device), and a non-effective portion, which is a portion not used for a product. An optical film piece to be cut for measurement of a haze value and the like should be cut out from the effective portion of the optical film. For example, portions 5 cm from both ends of the optical film in the width direction can be non-effective portions.

In cases where an additional film, such as polarizing plate, is provided on one surface of the optical film 10 through an adhesive or adhesion layer, the haze value of the optical film should be measured after removing the additional film and the adhesive or adhesion layer. The additional film can be removed, for example, as follows. First of all, a laminate consisting of an optical film attached to an additional film through an adhesive or adhesion layer is heated with a hair dryer and is slowly separated by inserting a cutter blade into a possible interface between the optical film and the additional film. By repeating such a process of heating and separation, the adhesive or adhesion layer and the additional film can be removed. Even if such a removal process is performed, measurement of the haze value is not significantly affected.

The optical film 10 preferably has a total light transmittance of 80% or more. The optical film 10 having a total light transmittance of 80% or more can obtain a sufficient light-transmitting property. A total light transmittance of 85% or more or 90% or more for the optical film 10 is preferable increasingly in this order (the larger the value, the more preferable).

The above-described total light transmittance can be measured using a haze meter (product name "HM-150"; manufactured by Murakami Color Research Laboratory Co., Ltd.) in accordance with JIS K7361-1: 1997. The above-described total light transmittance is defined as the arithmetic mean of three haze values, wherein the three haze values are obtained by cutting a piece of 50 mm×100 mm from one optical film and placing the piece of film without any curl or wrinkle and without any fingerprint or dirt, into the haze meter in such a manner that the inorganic layer side faces opposite to the light source to measure the haze value, and repeating the measurement three times. In the optical film 10, not only the surface 10A but also a laminated layer such as the hard coat layer 12 is visually observed to be flat and also has a deviation in film thickness within ±10%. Accordingly, it is considered that an approximate average total light transmittance of the whole optical film can be obtained by measuring the total light transmittance at three different positions on the piece cut out from the optical film. The deviation in total light transmittance is within ±10% even if a measurement object has a size as large as 1 m×3000 m or has the same size as a 5-inch smartphone. In cases where an optical film cannot be cut to the above-described size, a piece having a size of 22 mm×22 mm or larger may be cut out from the optical film as appropriate. If the optical film is small in size, the optical film is gradually shifted or turned in such an extent that the light source spot is within the piece of film to secure three measurement positions.

In cases where an additional film, such as polarizing plate, is provided on one surface of the optical film 10 through an adhesive or adhesion layer, the total light transmittance of an optical film should be measured after removing the additional film and the adhesive or adhesion layer in the same manner as described above. Even if such a removal process is performed, measurement of the total light transmittance is not significantly affected.

The optical film 10 preferably has a yellow index (YI) of 15 or less. In cases where the optical film 10 has a yellow index YI of 15 or less, the optical film is not so noticeably yellow and thus applicable to uses that require the optical film to be transparent. The upper limit of yellow index (YI) in the optical film 10 is more preferably 10 or less. The yellow index (YI) is obtained by measuring a cut piece of the optical film with a size of 50 mm×100 mm using a spectrophotometer (product name "UV-3100PC", manufactured by Shimadzu Corporation; light source: tungsten lamp and deuterium lamp), processing the obtained values according to the formula described in JIS Z8722: 2009 to calculate color tristimulus values X, Y, and Z, and processing the obtained tristimulus values X, Y, and Z according to a formula described in ASTM D1925: 1962 to calculate a yellow index. The above-described yellow index (YI) is the arithmetic mean of three measurements obtained by measuring a cut piece of the optical film.

In cases where an additional film, such as polarizing plate, is provided on one surface of the optical film 10 through an adhesive or adhesion layer, the yellow index (YI) should be measured after removing the additional film and the adhesive or adhesion layer in the same manner as described above. Even if such a removal process is performed, measurement of the yellow index (YI) is not significantly affected.

The yellow index (YI) of the optical film 10 may be adjusted, for example, by adding a coloring substance of blue color, the complementary color to yellow, to the light-transmitting base material 11 or the hard coat layer 12. Even if use of a base material composed of a polyimide resin as the light-transmitting base material 11 results in a yellow color problem, the yellow index (YI) of the optical film 10 can be decreased by adding a blue coloring substance to the light-transmitting base material 11 or the hard coat layer 12.

The above-described blue coloring substance may be either a pigment or a dye, and preferably has both light and heat resistance in cases where, for example, the optical film 10 is used in an organic light emitting diode display device. As the above-described blue coloring substance, an organic pigment such as a polycyclic or metal complex organic pigment is less prone to molecular breakage by ultraviolet light, in contrast to the tendency to form a molecular dispersion of the dye itself, and has a further excellent light resistance, and is thus suitable for uses that require an optical film to be, for example, light resistant. More specifically, phthalocyanine organic pigments are suitable. However, pigment particles are dispersed in a solvent and the scattered particles cause loss of transparency. Thus, the size of dispersed pigment particles is preferably in the Rayleigh scattering region. On the other hand, in cases where the transparency of an optical film is critical, a dye which is molecularly-dispersed in a solvent is preferably used as the above-described blue coloring substance.

The optical film 10 preferably has a light transmittance of 8% or less at a wavelength of 380 nm. In cases where the above-described transmittance of the optical film is 8% or less and such an optical film is used in a mobile terminal, a polarizer inside the mobile terminal can be inhibited from being degraded by exposure to ultraviolet light. The upper limit of the light transmittance of the optical film 10 is more preferably 5%. The above-described transmittance can be measured using a spectrophotometer (product name "UV-3100PC"; manufactured by Shimadzu Corporation; light source: tungsten lamp and deuterium lamp). The above-described transmittance is the arithmetic mean of three measurements obtained by measuring a cut piece of the optical film with a size of 50 mm×100 mm. The above-described transmittance of the optical film 10 can be achieved by adjusting the amount of the below-described ultraviolet absorber added to the hard coat layer 12.

From a foldability viewpoint, no crack or break is formed in the optical film 10 even in cases where the below-described folding test is repeated on the optical film preferably one hundred thousand times, more preferably two hundred thousand times, and further preferably one million times. In cases where the folding test is repeated on the optical film 10 one hundred thousand times and the optical film 10 is, for example, cracked, the optical film 10 shows low foldability.

In cases where an additional film, such as polarizing plate, is provided on one surface of the optical film through an adhesive or adhesion layer, the folding test for the optical film should be carried out after removing the additional film and the adhesive or adhesion layer from the optical film in the same manner as described above. In cases where a folding test is carried out on a laminate having an additional film attached to the optical film through an adhesive layer or an adhesion layer, it is preferable that no crack or break is formed in the optical film even after repeating the folding test ten thousand times.

Figure 3A:
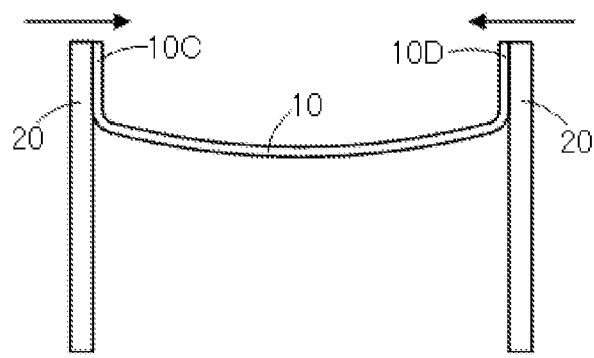
FIGS. 3(A) to 3(C) schematically illustrate each step of the folding test.

The folding test is carried out as follows. The folding test starts with fixing the edge 10C and opposite edge 10D of the optical film 10 cut to a size of 20 mm×100 mm to fixing members 20 arranged in parallel to each other, as shown in FIG. 3(A). In cases where an optical film cannot be cut to the above-described size, a piece having a size of 20 mm×40 mm or larger may be cut out from the optical film as appropriate. Additionally, the fixing members 20 can slide in the horizontal direction, as shown in FIG. 3(A).

Figure 3B:
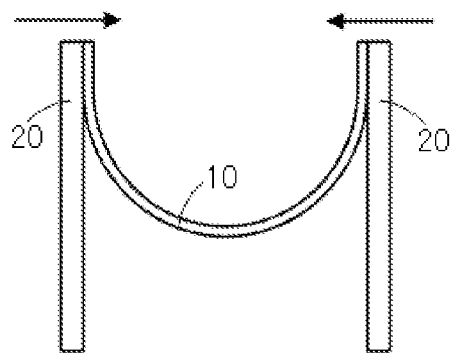
Figure 3C:
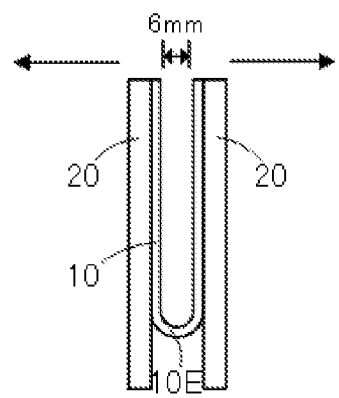

Next, the fixing members 20 are moved close to each other to fold and deform the optical film 10, as shown in FIG. 3(B); the fixing members 20 are further moved until a gap of 6 mm is left between the two opposing edges 10C and 10D of the optical film 10 fixed to the fixing members 20, as shown in FIG. 3(C); subsequently, the fixing members 20 are moved in opposite directions to resolve the deformation of the optical film 10.

As shown in FIG. 3(A) to (C), the fixing members 20 can be moved to fold the optical film 10. Additionally, a gap of 6 mm can be maintained between the two opposing edges of the optical film 10 by carrying out the folding test in a manner that prevents the bent part 10E of the optical film 10 from being forced out beyond the lower edges of the fixing members 20 and controls the fixing members 20 to keep a distance by means of a spacer or the like when they approach each other closest. In this case, the outer diameter of the bent part 10E is considered as 6 mm.

Additionally, it is preferable that no crack or break is formed in the optical film 10 after folding the optical film with the inorganic layer 13 facing inward at an angle of 180 degrees in such a manner that a gap of 2 mm is left between the opposite edges 10C and 10D of the optical film, unfolding the folded optical film, and repeating the process one hundred thousand times. Also in this case, the folding test is carried out in the same manner as described above except in such a manner that, after the fixing members 20 are further moved until a gap of 2 mm is left between the two opposing edges 10C and 10D of the optical film 10 fixed to the fixing members 20, the fixing members 20 are moved in opposite directions to resolve the deformation of the optical film 10.

In cases where an additional film, such as polarizing plate, is provided on one surface of the optical film 10 through an adhesive or adhesion layer, the folding test should be carried out after removing the additional film and the adhesive or adhesion layer in the same manner as described above. Even if such a removal process is performed, the folding test is not significantly affected.

The surface 10A of the optical film 10 preferably has a hardness (pencil hardness) of 2H or more as measured by the pencil hardness test defined by JIS K5600-5-4: 1999. The pencil hardness test should be carried out as follows: using a pencil hardness testing machine (product name "Pencil Scratch Hardness Tester (electric type)"; manufactured by Toyo Seiki Seisaku-sho, Ltd.), a pencil (product name "uni"; manufactured by Mitsubishi Pencil Co., Ltd.) is moved at a speed of 1 mm/second on the surface of an optical film piece having a cut size of 50 mm×100 mm while a load of 750 g is applied to the pencil. The grade of the hardest pencil that leaves no scratch on the surface of the optical film during the pencil hardness test is determined as the pencil hardness of the optical film. A plural number of pencils with different hardness are used for the measurement of pencil hardness and the pencil hardness test is repeated five times on each pencil. In cases where no scratch is made on the surface of the optical film with a pencil with specific hardness in four or more out of the five replicates, the pencil with the hardness is determined to make no scratch on the surface of the optical film. The above-described scratch refers to a scratch which is visibly detectable when the surface of an optical film subjected to the pencil hardness test is observed under transmitting fluorescent light. The pencil hardness of the surface 10A of the optical film 10 is preferably 3H or harder, more preferably 5H, and most preferably 6H or harder.

Light emitting diodes are actively employed in recent years as the backlight source for image display devices such as personal computers and tablet terminals and such light emitting diodes strongly emit light called blue light. The blue light has a wavelength of 380 to 495 nm and other properties similar to those of ultraviolet light, and the energy of the blue light is so high that the blue light not absorbed by the cornea and the crystalline lens and passing into the retina is considered as a cause of retinal damage, eye strain, sleep disorder, and the like. Thus, an optical film used in an image display device is preferred to have no influence on the color representation on a display screen and to have an excellent blue light blocking property. Therefore, the optical film 10 is preferred to have a spectral transmittance of less than 1% at a wavelength of 380 nm, a spectral transmittance of less than 10% at a wavelength of 410 nm, and a spectral transmittance of 70% or more at a wavelength of 440 nm in view of blue light blocking effect because the above-described optical film having a spectral transmittance of 1% or more at a wavelength of 380 nm or a spectral transmittance of 10% or more at a wavelength of 410 nm may not solve blue light problems and the optical film having a spectral transmittance of less than 70% at a wavelength of 440 nm may give some effects on the color representation on the display screen of an image display device in which the optical film is used. In the blue light wavelength range, the optical film 10 can sufficiently absorb light having a wavelength of 410 nm or less and sufficiently pass light having a wavelength of 440 nm or more, and can exhibit excellent blue light blocking performance without affecting the color representation on a display screen. Additionally, use of the optical film 10 with such an excellent blue light blocking property in an organic light emitting diode (OLED) display device as an image display device effectively inhibits degradation of the organic light emitting diode device.

Preferably, the optical film 10 has a transmittance of nearly 0% for light with a wavelength of up to 380 nm, gradually increases the light transmittance above a wavelength of 410 nm, and exhibits a sharp increase of light transmittance around a wavelength 440 nm. Specifically, the spectral transmittance of the optical film preferably varies sigmoidally with the wavelength, for example, from 410 nm to 440 nm. The above-described optical film has: more preferably a spectral transmittance of less than 0.5%, further preferably less than 0.2%, at a wavelength of 380 nm; more preferably a spectral transmittance of less than 7%, more preferably less than 5%, at a wavelength of 410 nm; and more preferably a spectral transmittance of 75% or more, further preferably 80% or more, at a wavelength of 440 nm. The optical film 10 preferably has a spectral transmittance of less than 50% at a wavelength 420 nm. The optical film 10 fulfilling such requirements with respect to spectral transmittance exhibits a sharp increase of transmittance around a wavelength of 440 nm and can obtain a very excellent blue light-blocking property without affecting the color representation on a display screen.

The optical film 10 has: more preferably a spectral transmittance of less than 0.1% at a wavelength of 380 nm; more preferably a spectral transmittance of less than 7% at a wavelength of 410 nm; and more preferably a spectral transmittance of 80% or more at a wavelength of 440 nm.

The slope as a function of wavelength obtained by the least square method applied to the transmittance of the optical film 10 is preferably more than 2.0 in a spectrum range from 415 to 435 nm. In cases where the above-described slope is 2.0 or less, the optical film fails to cut a sufficient amount of light in the blue light wavelength range, such as a wavelength range from 415 to 435 nm, and may exhibit an attenuated blue light-cutting function. Also, the optical film may cut an excess amount of light in the blue light wavelength range (wavelengths from 415 to 435 nm) and, in that case, interferes with the backlight or the light in a wavelength range emitted from an image display device (for example, light with wavelengths equal to and above 430 nm emitted from an OLED) and be highly likely to cause a problem such as poor color representation. The above-described slope can be calculated, for example, by measuring at least five points spaced 1 nm apart to obtain the transmittance data in a range from 415 to 435 nm using a spectrophotometer with the ability to permit measurement to 0.5 nm accuracy (product name "UV-3100PC"; manufactured by Shimadzu Corporation).

The optical film 10 preferably has a blue light blocking rate of 40% or more. In cases where the blue light blocking rate is less than 40%, the above-described blue light problems may not be sufficiently resolved. The above-described blue light blocking rate is calculated according to, for example, JIS T7333: 2005. Such a blue light blocking rate can be effected, for example, by adding the below-described sesamol type benzotriazole monomer to the hard coat layer 12.

Examples of applications of the optical film 10 include, but are not particularly limited to, image display devices in smartphones, tablet terminals, personal computers (PCs), wearable terminals, digital signage systems, televisions, automotive navigation systems, and the like. Additionally, the optical film 10 is also suitable for vehicle displays. The form of each above-described image display device is also favorable for applications which require flexible forms, such as foldable or rollable forms.

The optical film 10 can be cut into a desired size or may be rolled. In cases where the optical film 10 is cut into a desired size, the optical film is not limited to a particular size, and the size of the film is appropriately determined depending on the display size of an image display device. Specifically, the optical film 10 may be, for example, 2.8 inches or more and 500 inches or less in size. The term "inch" as used herein shall refer to the length of a diagonal when the optical film is rectangular, and to the length of a diameter when the optical film is circular, and to the average of major and minor axes when the optical film is elliptical. In this respect, if the optical film is rectangular, the aspect ratio of the optical film is not limited to a particular ratio when the above-described size in inch is determined, as long as no problem is found with the optical film used for the display screen of an image display device. Examples of the aspect ratio include height-to-width ratios of 1:1, 4:3, 16:10, 16:9, and 2:1. However, particularly in optical films used for vehicle displays and digital signage systems which are rich in designs, the aspect ratio is not limited to the above-described aspect ratios. Additionally, in cases where the optical film 10 is large in size, the optical film will be cut to the A5 size (148 mm×210 mm) starting at an arbitrary position and then cut to fit size requirements of each measurement item.

In an image display device, the optical film 10 may be installed inside the image display device, and is preferably installed near the surface of the image display device. In cases of being installed near the surface of an image display device, the optical film 10 serves as a cover film, which is used instead of a cover glass.

<<Light-transmitting Base Material>>

The light-transmitting base material 11 is a base material having a light transmitting property. The term "light-transmitting" as used herein refers to a property that allows light transmission, including, for example, a total light transmittance of 50% or more, preferably 70% or more, more preferably 80% or more, and particularly preferably 90% or more. The term "light-transmitting" does not necessarily refer to transparency and may refer to translucency.

The thickness of the light-transmitting base material 11 is preferably 10 µm or more and 100 µm or less. In cases where the thickness of the light-transmitting base material is 10 µm or more, the resulting optical film 10 can be inhibited from curling and also has such sufficient hardness that the pencil hardness is enabled to be 3H or harder. Furthermore, such an optical film produced by roll-to-roll process can be inhibited from forming wrinkles, and thus eliminates the fear of having a deteriorated appearance. In cases where the thickness of the light-transmitting base material 11 is 100 µm or less, the resulting optical film has sufficient foldability and is desirable in terms of weight saving. The thickness of the light-transmitting base material is defined as the arithmetic mean of thickness values measured at 10 different locations, where a cross-section of the light-transmitting base material is photographed using a scanning electron microscope (SEM) and the thickness of the light-transmitting base material is measured at the 10 locations within the image of the cross-section. The lower limit of the light-transmitting base material 11 is more preferably 25 µm or more in thickness, while the upper limit of the light-transmitting base material 11 is more preferably 80 µm or less in thickness.

Examples of the constituent material for the light-transmitting base material 11 include resins such as polyimide resins, polyamide-imide resins, polyamide resins, polyester resins (for example, polyethylene terephthalate and polyethylene naphthalate). Among those resins, polyimide resins, polyamide resins, and combinations thereof are preferred in terms of several criteria: the resulting optical film has excellent hardness and transparency as well as is less cracked or broken during the folding test, and also has such an outstanding heat resistance that the optical film can obtain further excellent hardness and transparency by film baking.

A polyimide resin can be obtained from the reaction between a tetracarboxylic component and a diamine component. The polyimide resin is not limited to a particular one and preferably has, for example, at least one structure selected from the group consisting of the structures represented by the general formula (1) below and the general formula (3) below, in terms of having an excellent light transmitting property and excellent rigidity.

[Chem. 1]

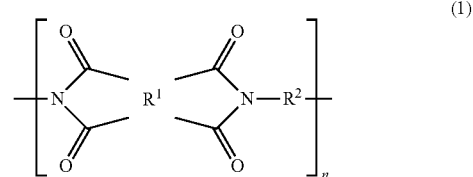

In the above-described general formula (1), $R^1$ represents a tetracarboxylic acid residue as a tetravalent group; $R^2$ represents at least one divalent group selected from the group consisting of trans-cyclohexanediamine residue, trans-1,4-bismethylene cyclohexanediamine residue, 4,4'-diaminodiphenyl sulfone residue, 3,4'-diaminodiphenyl sulfone residue, and divalent groups represented by the general formula (2) below; n represents the number of repeating units, which is 1 or more. In this specification, the "tetracarboxylic acid residue" refers to a residue remaining after subtracting four carboxylic groups from a tetracarboxylic acid, and represents the same structure as a residue remaining after subtracting the acid dianhydride structure from a tetracarboxylic dianhydride. Additionally, the "diamine residue" refers to a residue remaining after subtracting two amino groups from a diamine.

[Chem. 2]

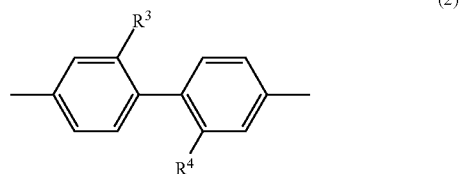

In the above-described general formula (2), $R^3$ and $R^4$ each independently represent a hydrogen atom, alkyl group, or perfluoroalkyl group.

[Chem. 3]

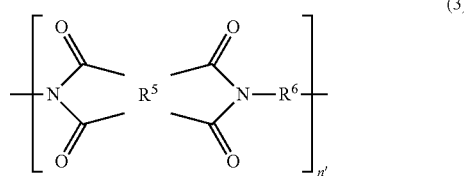

(3)

In the above-described general formula (3), $R^5$ represents at least one tetravalent group selected from the group consisting of cyclohexane tetracarboxylic acid residue, cyclopentane tetracarboxylic acid residue, dicyclohexane-3, 4,3',4'-tetracarboxylic acid residue, and 4,4'-(hexafluoroisopropylidene)diphthalic acid residue; $R^6$ represents a diamine residue as a divalent group; and n' represents the number of repeating units, which is 1 or more.

In the above-described general formula (1), $R^1$ refers to a tetracarboxylic acid residue and can represent, as indicated above, a residue remaining after subtracting the acid dianhydride structure from a tetracarboxylic dianhydride. As $R^1$ in the above-described general formula (1), at least one selected from the group consisting of 4,4'-(hexafluoroisopropylidene)diphthalic acid residue, 3,3',4,4'-biphenyl tetracarboxylic acid residue, pyromellitic residue, 2,3',3,4'-biphenyl tetracarboxylic acid residue, 3,3',4,4'-benzophenone tetracarboxylic acid residue, 3,3',4,4'-diphenylsulfone tetracarboxylic acid residue, 4,4'-oxydiphthalic acid residue, cyclohexane tetracarboxylic acid residue, and cyclopentane tetracarboxylic acid residue is preferably contained, among others, in terms of improving the light-transmitting property and the rigidity. At least one selected from the group consisting of 4,4'-(hexafluoroisopropylidene)diphthalic acid residue, 4,4'-oxydiphthalic acid residue, and 3,3',4,4'-diphenylsulfone tetracarboxylic acid residue is further preferably contained.

As $R^1$, those suitable residues are contained in total preferably at a content of 50% by mole or more, further preferably 70% by mole or more, and still further preferably 90% by mole or more.

Additionally, a combination of at least one selected from a group of tetracarboxylic acid residues suitable for improving the rigidity (group A), such as the group consisting of 3,3',4,4'-biphenyl tetracarboxylic acid residue, 3,3',4,4'-benzophenone tetracarboxylic acid residue, and pyromellitic residue, and at least one selected from a group of tetracarboxylic acid residues suitable for improving the transparency (group B), such as the group consisting of 4,4'-(hexafluoroisopropylidene)diphthalic acid residue, 2,3',3,4'-biphenyl tetracarboxylic acid residue, 3,3',4,4'-diphenylsulfone tetracarboxylic acid residue, 4,4'-oxydiphthalic acid residue, cyclohexane tetracarboxylic acid residue, and cyclopentane tetracarboxylic acid residue, is preferably used as $R^1$.

For the content ratio of the group of tetracarboxylic acid residues suitable for improving the rigidity (group A) to the group of tetracarboxylic acid residues suitable for improving the transparency (group B) in that case, preferably 0.05 moles or more and 9 moles or less, further preferably 0.1 moles or more and 5 moles or less, still further preferably 0.3 moles or more and 4 moles or less, of the group of tetracarboxylic acid residues suitable for improving the rigidity (group A) are combined with 1 mole of the group of tetracarboxylic acid residues suitable for improving the transparency (group B).

In the above-described general formula (1), $R^2$ preferably represents at least one divalent group selected from the group consisting of 4,4'-diaminodiphenyl sulfone residue, 3,4'-diaminodiphenyl sulfone residue, and divalent groups represented by the above-described general formula (2), further preferably at least one divalent group selected from the group consisting of 4,4'-diaminodiphenyl sulfone residue, 3,4'-diaminodiphenyl sulfone residue, and divalent groups represented by the above-described general formula (2) where R3 and R4 each represent a perfluoroalkyl group, among others, in terms of improving the light-transmitting property and the rigidity.

As $R^5$ in the above-described general formula (3), 4,4'-(hexafluoroisopropylidene)diphthalic acid residue, 3,3',4,4'-diphenylsulfone tetracarboxylic acid residue, and oxydiphthalic acid residue are preferably contained, among others, in terms of improving the light transmitting property and the rigidity.

As $R^5$, those suitable residues are contained preferably at a content of 50% by mole or more, further preferably 70% by mole or more, and still further preferably 90% by mole or more.

In the above-described general formula (3), $R^6$ refers to a diamine residue and can represent, as indicated above, a residue remaining after subtracting two amino groups from a diamine. As $R^6$ in the above-described general formula (3), preferably at least one divalent group selected from the group consisting of 2,2'-bis(trifluoromethyl)benzidine residue, bis[4-(4-aminophenoxy)phenyl]sulfone residue, 4,4'-diaminodiphenyl sulfone residue, 2,2-bis[4-(4-aminophenoxy)phenyl]hexafluoropropane residue, bis[4-(3-aminophenoxy)phenyl]sulfone residue, 4,4'-diamino-2,2'-bis(trifluoromethyl)diphenyl ether residue, 1,4-bis[4-amino-2-(trifluoromethyl)phenoxy]benzene residue, 2,2-bis[4-(4-amino-2-trifluoromethylphenoxy)phenyl] hexafluoropropane residue, 4,4'-diamino-2-(trifluoromethyl)diphenyl ether residue, 4,4'-diaminobenzanilide residue, N,N'-bis(4-aminophenyl) terephthalamide residue, and 9,9-bis(4-aminophenyl) fluorene residue, further preferably at least one divalent group selected from the group consisting of 2,2'-bis(trifluoromethyl)benzidine residue, bis[4-(4-aminophenoxy)phenyl]sulfone residue, and 4,4'-diaminodiphenyl sulfone residue, is contained, among others, in terms of improving the light transmitting property and the rigidity.

As $R^6$, those suitable residues are contained in total preferably at a content of 50% by mole or more, further preferably 70% by mole or more, and still further preferably 90% by mole or more.

Additionally, a combination of at least one selected from a group of diamine residues suitable for improving the rigidity (group C), such as the group consisting of bis[4-(4-aminophenoxy)phenyl]sulfone residue, 4,4'-diaminobenzanilide residue, N,N'-bis(4-aminophenyl)terephthalamide residue, paraphenylenediamine residue, methaphenylenediamine residue, and 4,4'-diaminodiphenylmethane residue, and at least one selected from a group of diamine residues suitable for improving the transparency (group D), such as the group consisting of 2,2'-bis(trifluoromethyl)benzidine residue, 4,4'-diaminodiphenyl sulfone residue, 2,2-bis[4-(4-aminophenoxy)phenyl]hexafluoropropane residue, bis[4-(3-aminophenoxy)phenyl]sulfone residue, 4,4'-diamino-2,2'-bis(trifluoromethyl)diphenyl ether residue, 1,4-bis[4-amino-2-(trifluoromethyl)phenoxy]benzene residue, 2,2-bis[4-(4-amino-2-trifluoromethylphenoxy)phenyl] hexafluoropropane residue, 4,4'-diamino-2-

(trifluoromethyl)diphenyl ether residue, and 9,9-bis(4-aminophenyl)fluorene residue, is preferably used as $R^6$.

For the content ratio of the group of diamine residues suitable for improving the rigidity (group C) to the group of diamine residues suitable for improving the transparency (group D) in that case, preferably 0.05 moles or more and 9 moles or less, further preferably 0.1 moles or more and 5 moles or less, more preferably 0.3 moles or more and 4 moles or less, of the group of diamine residues suitable for improving the rigidity (group C) are combined with 1 mole of the group of diamine residues suitable for improving the transparency (group D).

For the structures represented by the above-described general formulae (1) and (3), n and n' each independently represent the number of repeating units, which is 1 or more. The number of repeating units, n, in the polyimide may be appropriately selected depending on the structure to allow the polyimide to have a preferred glass transition temperature as described below, and is not limited to a particular number. The average number of repeating units is typically 10 to 2,000, further preferably 15 to 1,000.

Additionally, the polyimide resin may partially contain a polyamide structure. Examples of the polyamide structure that may be contained include a polyamide-imide structure containing a tricarboxylic acid residue such as trimellitic anhydride, and a polyamide structure containing a dicarboxylic acid residue such as terephthalic acid.

The polyimide resin preferably has a glass transition temperature of 250° C. or higher, further preferably 270° C. or higher, in terms of heat resistance, while the polyimide resin preferably has a glass transition temperature of 400° C. or lower, further preferably 380° C. or lower, in terms of ease of stretching and of reducing the baking temperature.

Specific examples of the polyimide resin include compounds having the structure represented by the formula below. In the formula below, n represents the number of repeating units, which is an integer of 2 or more.

[Chem. 4]

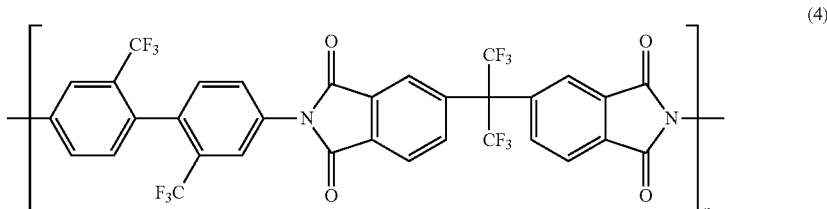

(4)

[Chem. 5]

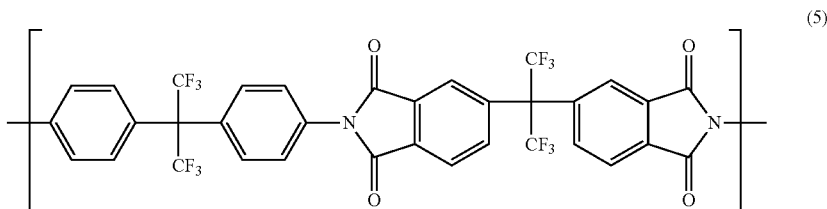

(5)

[Chem. 6]

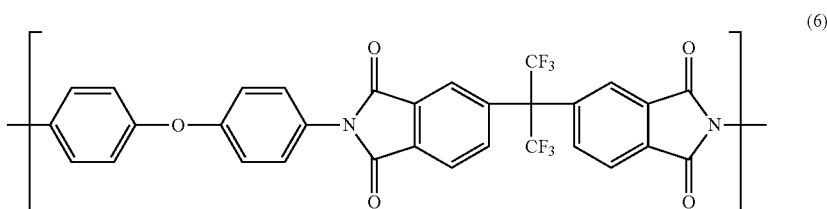

(6)

[Chem. 7]

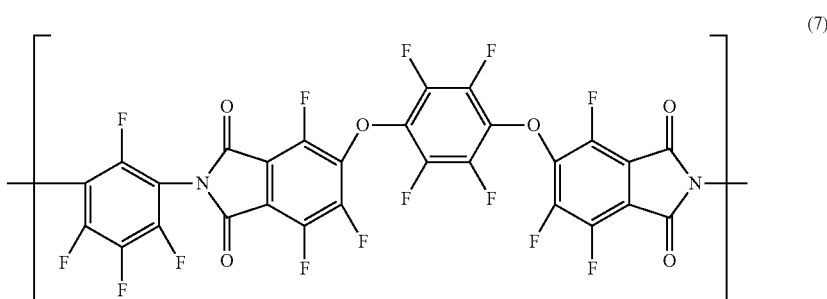

(7)

-continued
[Chem. 8]
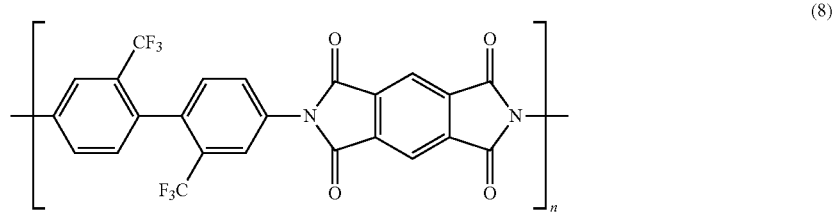
(8)
[Chem. 9]
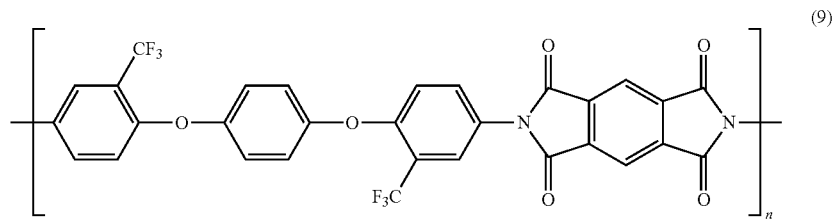
(9)
[Chem. 10]
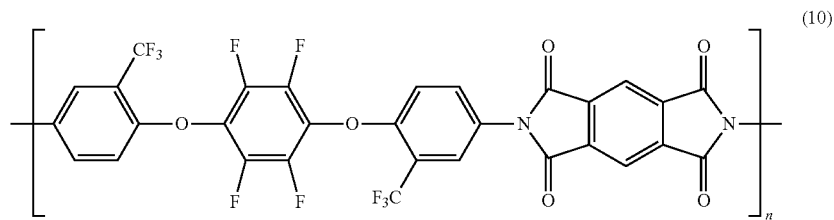
(10)
[Chem. 11]
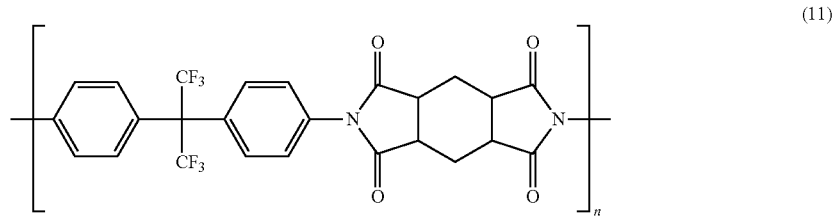
(11)
[Chem. 12]
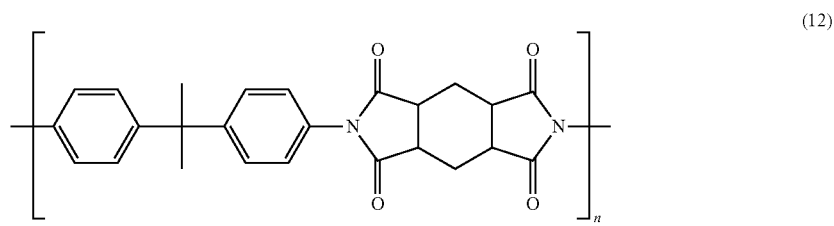
(12)
[Chem. 13]
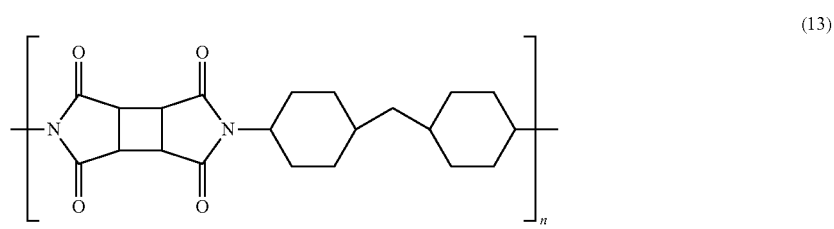
(13)

-continued
[Chem. 14]
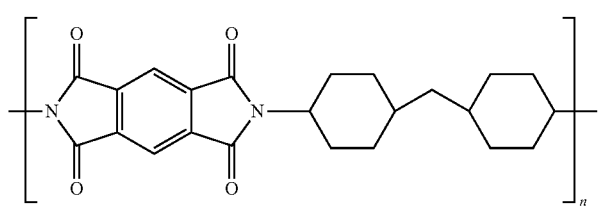
(14)
[Chem. 15]
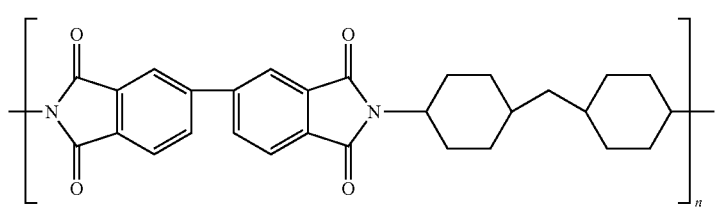
(15)
[Chem. 16]
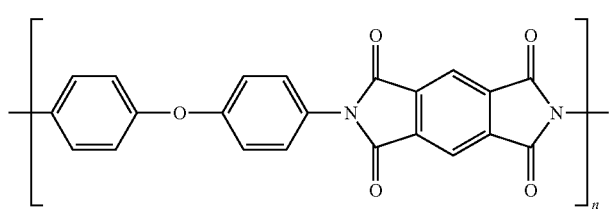
(16)
[Chem. 17]
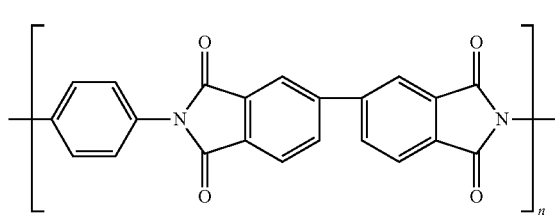
(17)
[Chem. 18]
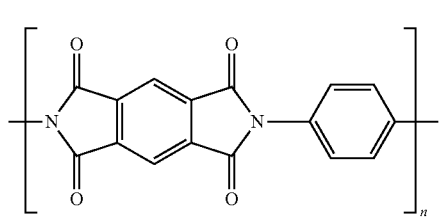
(18)
[Chem. 19]
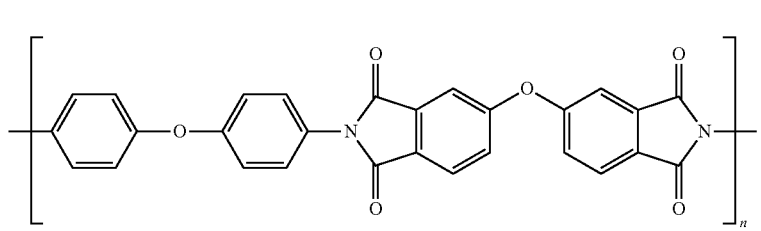
(19)

[Chem. 20]

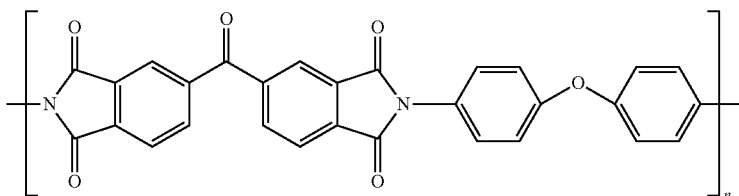

(20)

Among the above-described polyimide resins, the polyimide or polyamide resins having structures that inhibit intramolecular or intermolecular charge transfer are preferred due to the excellent transparency, specifically including the fluorinated polyimide resins represented by, for example, the above-described formulae (4) to (11) and the polyimide resins containing alicyclic structures represented by, for example, the above-described formulae (13) to (16).

Additionally, the fluorinated polyimide resins represented by, for example, the above-described formulae (4) to (11) each contain a fluorinated structure and thus have a high heat resistance, which protects a polyimide film composed of any of the polyimide resins from coloration by the heat generated during the synthesis of the polyimide resin and helps the polyimide resin to maintain excellent transparency.

The concept of polyamide resin includes aromatic polyamides (aramids) as well as aliphatic polyamides. The polyamide resin generally refers to a resin having the backbone represented by the formula (21) or (22) below, and examples of the above-described polyamide resin include a compound represented by the formula (23) below. In the formula below, n represents the number of repeating units, which is an integer of 2 or more.

[Chem. 21]

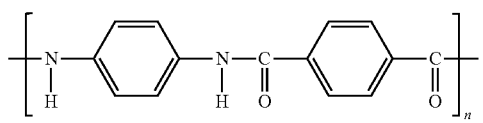

(21)

[Chem. 22]

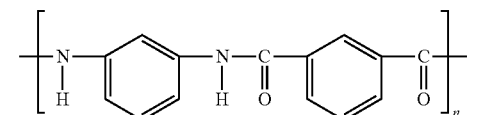

(22)

[Chem. 23]

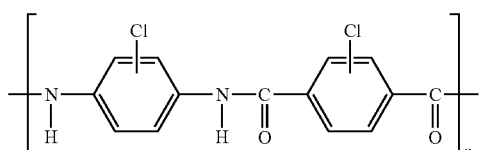

(23)

A commercially available base material may be used as a base material composed of the polyimide or polyamide resin represented by any of the above-described formulae (4) to (20) and (23). Examples of a commercially available base material composed of the above-described polyimide resin include Neopulim and the like manufactured by Mitsubishi Gas Chemical Company, Inc., while examples of a commercially available base material composed of the above-described polyamide resin include Mictron and the like manufactured by Toray Industries, Inc.

Additionally, a base material synthesized by a known method may be used as a base material composed of the polyimide or polyamide resin represented by any of the above-described formulae (4) to (20) and (23). For example, the polyimide resin represented by the above-described formula (4) is synthesized by a method described JP2009-132091A and can be obtained, specifically, by a reaction of 4,4'-hexafluoropropylidenebisphthalic dianhydride (FPA) and 2,2'-bis(trifluoromethyl)-4,4'-diaminobiphenyl (TFDB), as represented by the formula (24) below.

[Chem. 24]

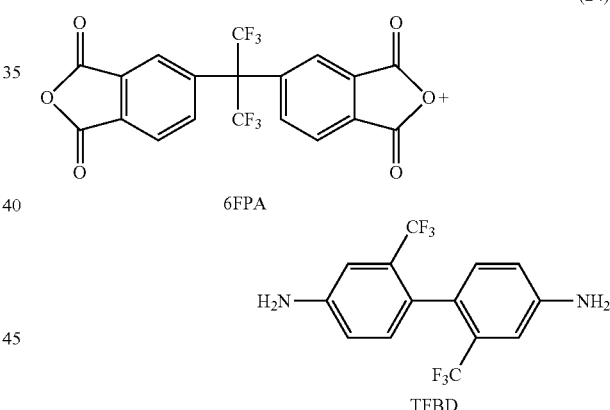

(24)

The weight average molecular weight of the above-described polyimide or polyamide resin preferably ranges from 3,000 to 500,000 inclusive, more preferably from 5,000 to 300,000, and further preferably from 10,000 to 200,000 inclusive. In cases where the weight average molecular weight is less than 3,000, the resin may not have enough strength; in cases where the weight average molecular weight is more than 500,000, the resin has an increased viscosity and a reduced solubility, which in turn may result in failure to provide a base material with smooth surface and homogeneous film thickness. In this specification, the "weight average molecular weight" is measured by gel permeation chromatography (GPC) as a value in terms of polystyrene.

Among the above-described polyimide and polyamide resins, the polyimide or polyamide resins having structures that inhibit intramolecular or intermolecular charge transfer are preferred due to the excellent transparency, specifically including the fluorinated polyimide resins represented by, for example, the above-described formulae (4) to (11), the polyimide resins containing alicyclic structures represented by, for example, the above-described formulae (13) to (16), and the halogenated polyamide resin represented by, for example, the above-described formula (23).

Additionally, the fluorinated polyimide resins represented by, for example, the above-described formulae (4) to (11) each contain a fluorinated structure and thus have a high heat resistance, which protects a base material composed of any of the polyimide resins from coloration by the heat generated during the synthesis of the polyimide resin and helps the polyimide resin to maintain excellent transparency.

As the light-transmitting base material 11, a base material composed of the fluorinated polyimide resin represented by, for example, any of the above-described formulae (4) to (11) or composed of the halogenated polyamide resin represented by, for example, the above-described formula (23) is preferably used because use of such a base material allows the resulting optical film to have a hardness of 3H or harder when measured under the same conditions of the pencil hardness test specified by JIS K5600-5-4: 1999 as those used for the surface 13A of the inorganic layer 13 (load: 1 kg, speed: 1 mm/second). Among those base materials, a base material composed of the polyimide resin represented by the above-described formula (4) is more preferably used because use of the base material can provide very excellent hardness with a pencil hardness of 3H or harder as described above to the resulting optical film.

Examples of the polyester resin include resins containing at least one of polyethylene terephthalate, polypropylene terephthalate, polybutylene terephthalate, and polyethylene naphthalate as a component.

«Hard Coat Layer»

The hard coat layer 12 has an indentation hardness ($H_{IT}$) of 200 MPa or more. As used herein, "indentation hardness" refers to a value determined from a load-displacement curve obtained in hardness measurement by a nanoindentation method and drawn from the loading to unloading of an indenter. As the lower limit of the indentation hardness ($H_{IT}$) of the hard coat layer 12, 200 MPa or more, 500 MPa or more, or 800 MPa or more is preferable in this order (the larger the value, the more preferable). As the upper limit of the indentation hardness of the hard coat layer 12, 1500 MPa or less, 1300 MPa or less, or 1100 MPa or less is preferable in this order (the smaller the value, the more preferable) in terms of inhibiting the hard coat layer 12 from generating breaks or cracks when the optical film 10 is folded.

Measurement of the indentation hardness ($H_{IT}$) should be performed on a measurement sample using a "TI950 TriboIndenter" manufactured by Hysitron, Inc. Specifically, a piece having a size of 1 mm×10 mm is cut out from the optical film and embedded in an embedding resin to prepare a block, and homogeneous sections having a thickness of 70 nm or more and 100 nm or less and having no openings or the like are cut out from the block according to a commonly used sectioning technique. For the preparation of sections, an "Ultramicrotome EM UC7" (Leica Microsystems GmbH) or the like can be used. Then, the block remaining after cutting out the homogeneous sections having no openings or the like is used as a measurement sample. Subsequently, a Berkovich indenter (a trigonal pyramid, TI-0039, manufactured by BRUKER Corporation) as the above-described indenter is pressed perpendicularly into the cross-section of the hard coat layer in the cross-section of the measurement sample obtained after cutting out the sections, wherein the indenter is pressed up to the maximum pressing load of 500 μN over 25 seconds under the below-mentioned measurement conditions. Here, a Berkovich indenter should be pressed into a part of the hard coat layer in order to avoid the influence of the light-transmitting base material and the inorganic layer and avoid the influence of the side edges of the hard coat layer, wherein the part is 500 nm away into the central side of the hard coat layer from the interface between the light-transmitting base material and the hard coat layer, 500 nm away into the central side of the hard coat layer from the interface between the hard coat layer and the inorganic layer, and 500 nm away into the central side of the hard coat layer from both side edges of the hard coat layer. In cases where a functional layer is present between the light-transmitting base material and the hard coat layer, the Berkovich indenter should be pressed into a part of the hard coat layer, wherein the part is 500 nm away into the central side of the hard coat layer from the interface between the functional layer and the hard coat layer, 500 nm away into the central side of the hard coat layer from the interface between the hard coat layer and the inorganic layer, and 500 nm away into the central side of the hard coat layer from both side edges of the hard coat layer. Subsequently, the intender is held at the position for a certain period of time to relax the residual stress, and then unloaded over 25 seconds to measure the maximum load after the relaxation, and the maximum load $P_{max}$ (μN) and the contact projection area $A_p$ (nm$^2$) are used to calculate an indentation hardness ($H_{IT}$) from the value of $P_{max}/A_p$. The contact projection area is a contact projection area, for which the tip curvature of the indenter is corrected using fused quartz (5-0098, manufactured by BRUKER Corporation) as a standard sample in accordance with the Oliver-Pharr method. The arithmetic mean of the measurements at 10 different locations is determined as the indentation hardness ($H_{IT}$). In cases where the measurement values include a value deviating ±20% or more from the arithmetic mean value, the deviating value should be excluded, followed by remeasurement. Whether the measurement values include a value deviating ±20% or more from the arithmetic mean value should be determined on the basis of whether a value (%) calculated from (A−B)/B×100 is ±20% or more, wherein A is a measurement value, and B is the arithmetic mean value. The indentation hardness ($H_{IT}$) can be adjusted by selecting the kind of the binder resin 12A, the amount of the inorganic particles 12B, and the like as below mentioned.

(Measurement Conditions)
 loading speed: 20 μN/second;
 retention time: 5 seconds;
 unloading speed: 20 μN/second;
 measurement temperature: 25° C.

The hard coat layer 12 has a film thickness of 1 μm or more. The hard coat layer 12 having a film thickness of 1 μm or more allows steel wool to fall in to a smaller degree in a steel wool test, and thus makes it possible to inhibit the surface of the hard coat layer from being scratched. As the lower limit for the hard coat layer 12, 2 μm or more, 3 μm or more, or 4 μm or more is preferable in this order (the larger the value, the more preferable). As the upper limit for the hard coat layer 12, 10 μm or less, 9 μm or less, 8 μm or less, or 7 μm or less is preferable in this order (the smaller the value, the more preferable) in terms of obtaining sufficient foldability.

The film thickness of the hard coat layer is defined as the arithmetic mean of film thickness values measured at 10 different locations, where a cross-section of the hard coat layer is photographed using a scanning transmission electron microscope (STEM) or a transmission electron microscope (TEM), and the film thickness of the hard coat layer is measured at the 10 locations within the image of the cross-section. A specific method of acquiring cross-sectional images is described below. First of all, a piece of 1 mm×10 mm cut out from an optical film is embedded in an embedding resin to prepare a block, and homogeneous sections having a thickness of 70 nm or more and 100 nm or less and having no openings or the like are cut out from the block according to a commonly used sectioning technique. For the preparation of sections, an "Ultramicrotome EM UC7" (Leica Microsystems GmbH) or the like can be used. Then, these homogeneous sections having no openings or the like are used as measurement samples. Subsequently, cross-sectional images of the measurement sample are acquired using a scanning transmission electron microscope (STEM) (product name "S-4800"; manufactured by Hitachi High-Technologies Corporation). The cross-sectional images are acquired using the above-described S-4800 by setting the detector to "TE," the accelerating voltage to "30 kV," and the emission current to "10 µA." The focus, contrast, and brightness are appropriately adjusted at a magnification of 5000 to 200,000 times, so that each layer can be identified by observation. The magnification is preferably 10,000 times to 100,000 times, more preferably 10,000 times to 50,000 times, most preferably 25,000 times to 50,000 times. Furthermore, the beam monitor aperture, the objective lens aperture, and the WD may be respectively set to "3," "3," and "8 mm," in acquirement of cross-sectional images using the above-described S-4800. For the measurement of the film thickness of the hard coat layer, it is important that the contrast at the interfacial boundary between the hard coat layer and another layer (for example, the functional layer) can be observed as clearly as possible when the cross-section is observed. In cases where the interfacial boundary is hardly observed due to lack of contrast, a staining process may be applied because interfacial boundaries between organic layers become easily observed by application of a staining procedure with osmium tetraoxide, ruthenium tetraoxide, phosphotungstic acid, or the like. Additionally, higher magnification may make it more difficult to find the interfacial contrast. In that case, the observation is also carried out with low magnification. For example, the observation is carried out with two magnifications consisting of a higher magnification and a lower magnification, such as 25,000 and 50,000 times, or 50,000 and 100,000 times, to determine the above arithmetic means at both magnifications, which are further averaged to determine the film thickness of the hard coat layer.

The hard coat layer 12 contains a binder resin 12A and inorganic particles 12B. The hard coat layer 12 may contain an additive such as an ultraviolet absorber or a spectral transmittance modifier in addition to the binder resin 12A and the inorganic particles 12B.

The inorganic particles 12B preferably have an area ratio of 5% or more and 75% or less in the region IR (hereinafter may be referred to as an "interfacial region") up to a depth of 500 nm into the hard coat layer 12 shown in FIG. 2 from the interface IF between the hard coat layer 12 and the inorganic layer 13 in the cross-section of the hard coat layer 12 in the film thickness direction. The inorganic particles having an area ratio of 5% or more in the interfacial region IF mean that the hard coat layer 12 contains the inorganic particles 12B in a large amount, and thus can make the hard coat layer 12 harder and enhance the adhesiveness to the inorganic layer 13. A steel wool test is carried out with a load applied onto the surface of the inorganic layer, and the load is applied onto the inorganic layer not only in the film thickness direction but also in the shear direction so that the steel wool can rub the surface of the inorganic layer. The inorganic particles 12B having an area ratio of 75% or less in the interfacial region IR are less likely to cause scratches and chips even when a load is applied in the shear direction in a steel wool test, because the binder resin 12A is present to some extent in the hard coat layer 12. Additionally, the binder resin 12A present to some extent in the hard coat layer 12 also makes it possible to further enhance the adhesiveness to the functional layer 14. Here, the area ratio of the inorganic region in the interfacial region is determined because the interfacial region is a region which is particularly susceptible to scratching and chipping when a steel wool test is carried out. As the lower limit of the area ratio of the inorganic particles 12B in the interfacial region IF, 23% or more, 33% or more, or 44% or more is preferable in this order (the larger the value, the more preferable). As the upper limit of the area ratio of the inorganic particles 12B in the interfacial region IF, 71% or less, 67% or less, or 60% or less is preferable in this order (the smaller the value, the more preferable).

The area ratio of the inorganic particles in the interfacial region should be determined as below-mentioned. First of all, a piece of 1 mm×10 mm cut out from an optical film is embedded in an embedding resin to prepare a block, and 10 homogeneous sections having a thickness of 70 nm or more and 100 nm or less and having no openings or the like are cut out from the block according to a commonly used sectioning technique. For the preparation of sections, an "Ultramicrotome EM UC7" (Leica Microsystems GmbH) or the like can be used. Then, these 10 homogeneous sections having no openings or the like are used as measurement samples. Then, a cross-sectional image of each measurement sample is acquired using a transmission electron microscope (TEM) or a scanning transmission electron microscope (STEM). Here, the cross-sectional image of one part per measurement sample should be acquired. In cases where the cross-sectional image of each measurement sample is acquired using a scanning transmission electron microscope (STEM) (product name "S-4800"; manufactured by Hitachi High-Technologies Corporation), this cross-sectional image is acquired by setting the detector to "TE," the accelerating voltage to "30 kV," and the emission current to "10 µA." The focus, contrast, and brightness are appropriately adjusted at a magnification of 5000 to 200,000 times, so that each layer can be identified by observation. The magnification is preferably 10,000 times to 100,000 times, more preferably 10,000 times to 50,000 times, most preferably 25,000 times to 50,000 times. Furthermore, the beam monitor aperture, the objective lens aperture, and the WD may be respectively set to "3," "3," and "8 mm," in acquirement of cross-sectional images. Assuming that the area of the interfacial region is 100% in each of the obtained 10 cross-sectional images, the ratio (area ratio) of the area of the inorganic particles to the area of the interfacial region is determined. The area ratio of the inorganic particles in the interfacial region is the arithmetic mean value of the area ratios of the inorganic particles determined from the 10 cross-sectional images of the interfacial region. To obtain such an area ratio of the inorganic particles 12B, the inorganic particles 12B are preferably contained, for example, at a ratio (weight ratio) of 10% or more and 300% or less, preferably 10% or more to 200%, relative to a polymerizable compound cured to become the binder resin 12A.

The inorganic layer 13 side of the hard coat layer 12 may be treated to expose the inorganic particles 12B by a method of etching the binder resin 12A selectively or another method. Carrying out such a treatment can further enhance adhesiveness between the hard coat layer 12 and the inorganic layer 13. However, carrying out this treatment to an excessive degree causes the inorganic layer side of the hard coat layer to be rough, and the small film thickness of the inorganic layer causes the surface figure of the hard coat layer to be transferred to the surface figure of the inorganic layer, with the result that, when a steel wool test is carried out, the rough figure of the surface of the inorganic layer catches steel wool, and thus, will undesirably cause a decrease in scratch resistance. Examples of methods of etching the binder resin selectively include glow discharge treatment, plasma treatment, ion etching treatment, and alkali treatment.

<Binder Resin>

The binder resin 12A contains at least one of a polymerized product (a cured product) of a polymerizable compound (a curable compound) and a thermoplastic resin. The polymerizable compound refers to a molecule having at least one of radical polymerizable functional groups and cationic polymerizable functional groups. Hereinafter, a polymerizable compound having a radical polymerizable functional group is referred to as a radical polymerizable compound, and a polymerizable compound having a cationic polymerizable functional group referred to as a cationic polymerizable compound. Examples of radical polymerizable functional groups include ethylenic unsaturated groups such as a (meth)acryloyl group, vinyl group, and allyl group. Both "acryloyl group" and "methacryloyl group" are meant by the word "(meth)acryloyl group." Examples of cationic polymerizable functional groups include a hydroxyl group, carboxyl group, isocyanate group, amino group, cyclic ether group, mercapto group, and the like.

The binder resin 12A preferably contains less than 10% by mass of a polymerizable compound having a polymerizable functional group equivalent amount (weight average molecular weight/number of polymerizable functional groups) of 130 or more. Containing less than 10% by mass of such a polymerizable compound can impart hardness to the hard coat layer 12, and thus, allows the surface 10A of the optical film 10 to be less susceptible to scratching and chipping even when subjected to a steel wool test. Thus, the adhesiveness between the hard coat layer 12 and the functional layer 14 can also be enhanced.

The radical polymerizable compound is preferably a polyfunctional (meth)acrylate. Examples of the above-described polyfunctional (meth)acrylate include trimethylolpropane tri(meth)acrylate, tripropylene glycol di(meth)acrylate, diethylene glycol di(meth)acrylate, dipropylene glycol di(meth)acrylate, pentaerythritol tri(meth)acrylate, pentaerythritol tetra(meth)acrylate, dipentaerythritol hexa(meth)acrylate, 1,6-hexanediol di(meth)acrylate, neopentyl glycol di(meth)acrylate, trimethylolpropane tri(meth)acrylate, ditrimethylolpropane tetra(meth)acrylate, dipentaerythritol penta(meth)acrylate, tripentaerythritol octa(meth)acrylate, tetrapentaerythritol deca(meth)acrylate, isocyanuric acid tri(meth)acrylate, isocyanuric acid di(meth)acrylate, polyester tri(meth)acrylate, polyesterdi(meth)acrylate, bisphenol di(meth)acrylate, diglycerol tetra(meth)acrylate, adamantyl di(meth)acrylate, isobornyl di(meth)acrylate, dicyclopentane di(meth)acrylate, tricyclodecane di(meth)acrylate, ditrimethylolpropane tetra(meth)acrylate, and those compounds modified with PO, EO, caprolactone, or the like.

Among those polymerizable compounds, trifunctional to hexafunctional polymerizable compounds, such as pentaerythritol triacrylate (PETA), dipentaerythritol hexaacrylate (DPHA), pentaerythritol tetraacrylate (PETTA), dipentaerythritol pentaacrylate (DPPA), trimethylolpropane tri(meth)acrylate, tripentaerythritol octa(meth)acrylate, and tetrapentaerythritol deca(meth)acrylate, are preferred in terms of the ability to achieve the above-described indentation hardness in a suitable manner. In this specification, the word "(meth)acrylate" means acrylate and methacrylate.

The polymerizable compound may further contain a monofunctional (meth)acrylate monomer for the purpose of, for example, adjusting the hardness of the resin and the viscosity of the composition, and improving the adhesiveness of the resin. Examples of the above-described monofunctional (meth)acrylate monomer include hydroxyethyl acrylate (HEA), glycidyl methacrylate, methoxypolyethylene glycol (meth)acrylate, isostearyl (meth)acrylate, 2-acryloyloxyethyl succinate, acryloyl morpholine, N-acryloyloxyethyl hexahydrophthalimide, cyclohexyl acrylate, tetrahydrofuryl acrylate, isobornyl acrylate, phenoxyethyl acrylate, and adamantyl acrylate.

The weight average molecular weight of the above-described monomer is preferably less than 1,000, more preferably 200 or more and 800 or less, in terms of improving the hardness of the hard coat layer 12. Additionally, the weight average molecular weight of the above-described polymerizable oligomer is preferably 1,000 or more and 20,000 or less, more preferably 1,000 or more and 10,000 or less, and further preferably 2,000 or more and 7,000 or less.

Examples of cationic polymerizable compounds include, but are not particularly limited to, epoxy compounds, polyol compounds, isocyanate compounds, melamine compounds, urea compounds, phenol compounds, and the like.

Examples of thermoplastic resins include styrenic resins, (meth)acrylic resins, vinyl acetate resins, vinyl ether resins, halogen-containing resins, alicyclic olefinic resins, polycarbonate resins, polyester resins, polyamide resins, cellulose derivatives, silicone resins, rubbers or elastomers, and the like.

<Inorganic Particles>

The inorganic particles 12B are particles composed mainly of an inorganic substance. The inorganic particles 12B may contain an organic component, but are preferably composed only of an inorganic substance. The inorganic particles 12B may be surface-treated with an organic component. The inorganic particles 12B are not limited to a particular type of inorganic particles as long as those inorganic particles can improve the hardness, and silica particles are preferred in terms of the ability to achieve excellent hardness.

Among silica particles, reactive silica particles are preferred. The above-described reactive silica particle can form a cross-linked structure with the above-described polyfunctional (meth)acrylate and the presence of the reactive silica particles can sufficiently increase the hardness of the hard coat layer.

The above-described reactive silica particle preferably has a reactive functional group on the surface, and a polymerizable functional group, such as those described above, is suitably used as the reactive functional group.

The above-described reactive silica particles are not limited to a particular type of reactive silica particles, and conventionally known reactive silica particles, such as reactive silica particles described in JP2008-165040A, can be used. Additionally, examples of commercially available reactive silica particles as describe above include MIBK-SD, MIBK-SDMS, MIBK-SDL, and MIBK-SDZL manufactured by Nissan Chemical Industries, Ltd.; and V8802 and V8803 manufactured by JGC C&C.

Additionally, the above-described silica particles may be spherical silica particles and are preferably deformed silica particles. In this specification, the "spherical silica particle"

refers to, for example, a spherical or ellipsoidal silica particle, while "deformed silica particle" refers to a silica particle with a randomly rough surface as observed on potato tubers. The surface area of the above-described deformed silica particle is larger than that of a spherical silica particle, and the presence of such deformed silica particles thus increases the contact area with, for example, the above-described polyfunctional (meth)acrylate and successfully improves the hardness of the above-described hard coat layer. A transmission electron microscope (TEM) or a scanning transmission electron microscope (STEM) can be used for observation of the cross-section of the functional layer to determine whether or not the reactive silica particles are deformed silica particles as described above.

The average particle diameter of the above-described silica particles is preferably 8 nm or more and 100 nm or less. The silica particles having an average particle diameter of 8 nm or more can result in effecting sufficient adhesiveness to the inorganic layer 13, and 100 nm or less can inhibit the resulting display from turning white in color. As the upper limit of the average particle diameter of the silica particles, 65 nm or less, 40 nm or less, or 25 nm or less is preferable in this order (the smaller the value, the more preferable). In cases where the silica particles are spherical silica particles, the average particle diameter of the silica particles corresponds to a value measured using image processing software from an image obtained using a transmission electron microscope (TEM) or a scanning transmission electron microscope (STEM). Additionally, in cases where the silica particles are deformed silica particles, the average particle diameter of the silica particles corresponds to the average between the maximum (major axis) and minimum (minor axis) values of the distance between two points on the circumference of each deformed silica particle exhibited in the image obtained using a transmission electron microscope (TEM) or a scanning transmission electron microscope (STEM).

As silica particles, a combination of two or more kinds of silica particles is preferably used. For example, the silica particles may be a combination of the above-described reactive silica particles and nonreactive silica particles or a combination of first silica particles and second silica particles having a smaller particle diameter than the first silica particles. Using a combination of the reactive silica particles and the nonreactive silica particles makes it possible to inhibit curl and at the same time maintain the adhesiveness to the inorganic layer 13 and scratch resistance. Additionally, using a combination of the first silica particles and the second silica particles makes it possible to further enhance the hardness of the hard coat layer and thus, further enhance scratch resistance.

<Ultraviolet Absorber>

Optical films are particularly suitably used in mobile terminals such as bendable smartphones and tablet terminals, and such mobile terminals are often used outdoors and thus each have a problem that a polarizer located closer to a display element than an optical film is easily degraded by exposure to ultraviolet light. However, in cases where a hard coat layer placed on the surface of a polarizer facing toward a display screen contains an ultraviolet absorber, the hard coat layer can advantageously prevent the polarizer from being degraded by exposure to ultraviolet light.

Examples of the ultraviolet absorber include triazine-based ultraviolet absorbers, benzophenone-based ultraviolet absorbers, and benzotriazole-based ultraviolet absorbers.

Examples of the above-described triazine-based ultraviolet absorbers include 2-(2-hydroxy-4-[1-octyloxycarbonylethoxy]phenyl)-4,6-bis(4-phenylphenyl)-1,3,5-triazine, 2-[4-[(2-hydroxy-3-dodecyloxypropyl)oxy]-2-hydroxyphenyl]-4,6-bis(2,4-dimethylphenyl)-1,3,5-triazine, 2,4-bis[2-hydroxy-4-butoxyphenyl]-6-(2,4-dibutoxyphenyl)-1,3,5-triazine, 2-[4-[(2-hydroxy-3-tridecyloxypropyl)oxy]-2-hydroxyphenyl]-4,6-bis(2,4-dimethylphenyl)-1,3,5-triazine, and 2-[4-[(2-hydroxy-3-(2'-ethyl)hexyl)oxy]-2-hydroxyphenyl]-4,6-bis(2,4-dimethylphenyl)-1,3,5-triazine. Examples of commercially available triazine-based ultraviolet absorbers include Tinuvin 460, Tinuvin 477 (both are manufactured by BASF SE), and LA-46 (manufactured by ADEKA Corporation).

Examples of the above-described benzophenone-based ultraviolet absorbers include 2-hydroxybenzophenone, 2,4-dihydroxybenzophenone, 2,2'-dihydroxy-4,4'-dimethoxybenzophenone, 2,2',4,4'-tetrahydroxybenzophenone, 2-hydroxy-4-methoxybenzophenone, hydroxymethoxybenzophenone sulfonate and its trihydrate, and sodium hydroxymethoxybenzophenone sulfonate. Examples of commercially available benzophenone-based ultraviolet absorbers include CHMASSORB 81/FL (manufactured by BASF SE).

Examples of the above-described benzotriazole-based ultraviolet absorbers include 2-ethylhexyl-3-[3-tert-butyl-4-hydroxy-5-(5-chloro-2H-benzotriazol-2-yl)phenyl]propionate, 2-(2H-benzotriazol-2-yl)-6-(linear and branched dodecyl)-4-methylphenol, 2-[5-chloro (2H)-benzotriazol-2-yl]-4-methyl-6-(tert-butyl)phenol, 2-(2H-benzotriazol-2-yl)-4,6-di-tert-pentylphenol, 2-(2'-hydroxy-5'-methylphenyl)benzotriazole, 2-(2'-hydroxy-3',5'-di-tert-butylphenyl)benzotriazole, 2-(2'-hydroxy-3'-tert-butyl-5'-methylphenyl)benzotriazole, 2-(2'-hydroxy-3',5'-di-tert-butylphenyl)-5-chlorobenzotriazole, 2-(2'-hydroxy-3'-(3",4",5",6"-tetrahydrophthalimidomethyl)-5'-methylphenyl)benzotriazole, 2,2-methylenebis(4-(1,1,3,3-tetramethylbutyl)-6-(2H-benzotriazol-2-yl)phenol), and 2-(2'-hydroxy-3'-tert-butyl-5'-methylphenyl)-5-chlorobenzotriazole. Examples of commercially available benzotriazole-based ultraviolet absorbers include KEMISORB 71D, KEMISORB 79 (both are manufactured by Chemipro Kasei Kaisha, Ltd.), JF-80, JAST-500 (both are manufactured by Johoku Chemical Co., Ltd.), ULS-1933D (manufactured by Lion Specialty Chemicals Co., Ltd.), and RUVA-93 (manufactured by Otsuka Chemical Co., Ltd.).

Among those ultraviolet absorbers, triazine-based and benzotriazole-based ultraviolet absorbers are suitably used. Preferably, the ultraviolet absorber is highly soluble in a resin component included in the functional layer, and also bleeds less out from the functional layer after the above-described folding test. The ultraviolet absorber has preferably been polymerized or oligomerized. As the ultraviolet absorber, polymers or oligomers containing the benzotriazole, triazine, or benzophenone backbone are preferred, specifically including ultraviolet absorbers obtained by thermal copolymerization of a (meth)acrylate containing the benzotriazole or benzophenone backbone and a methylmethacrylate (MMA) at an arbitrary ratio. In cases where the optical film is applied to an organic light emitting diode (OLED) display device, the ultraviolet absorber can play a role in protection of the OLED from ultraviolet light.

The ultraviolet absorber content is not limited to a particular amount but is preferably 1 part by mass or more and 6 parts by mass or less relative to 100 parts by mass of solids in the functional layer composition. In cases where the content is less than 1 part by mass, the functional layer may be allowed to contain only an insufficient amount of the above-described ultraviolet absorber; in cases where the content is more than 6 parts by mass, a marked coloration and a reduction of strength may occur on the functional layer. The minimum content of the above-described ultraviolet absorber is more preferably 2 parts by mass or more, while the maximum content of the above-described ultraviolet absorber is more preferably 5 parts by mass or less.

<Spectral Transmittance Modifier>

The spectral transmittance modifier is an agent for modifying the spectral transmittance of an optical film. In cases where the hard coat layer 12 contains, for example, the sesamol type benzotriazole monomer represented by the general formula (25) below, the above-described spectral transmittance can be suitably achieved.

[Chem. 25]

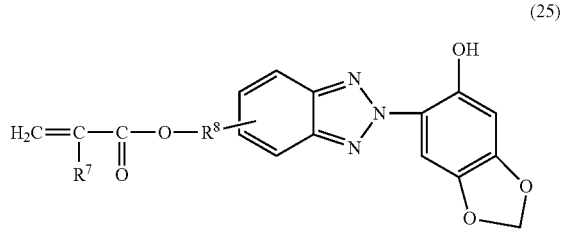

(25)

In the formula, $R^7$ represents a hydrogen atom or methyl group; $R^8$ represents a linear or branched alkylene or oxyalkylene group having 1 to 6 carbon atoms.

The above-described sesamol type benzotriazole monomer is not limited to a particular sesamol type benzotriazole monomer. Specific examples of the substance can include 2-[2-(6-hydroxybenzo[1,3]dioxol-5-yl)-2H-benzotriazole-5-yl]ethylmethacrylate, 2-[2-(6-hydroxybenzo[1,3]dioxol-5-yl)-2H-benzotriazole-5-yl]ethylacrylate, 3-[2-(6-hydroxybenzo[1,3]dioxol-5-yl)-2H-benzotriazole-5-yl]propylmethacrylate, 3-[2-(6-hydroxybenzo[1,3]dioxol-5-yl)-2H-benzotriazole-5-yl]propylacrylate, 4-[2-(6-hydroxybenzo[1,3]dioxol-5-yl)-2H-benzotriazole-5-yl]butylmethacrylate, 4-[2-(6-hydroxybenzo[1,3]dioxol-5-yl)-2H-benzotriazole-5-yl]butylacrylate, 2-[2-(6-hydroxybenzo[1,3]dioxol-5-yl)-2H-benzotriazole-5-yloxy]ethylmethacrylate, 2-[2-(6-hydroxybenzo[1,3]dioxol-5-yl)-2H-benzotriazole-5-yloxy]ethylacrylate, 2-[3-{2-(6-hydroxybenzo[1,3]dioxol-5-yl)-2H-benzotriazole-5-yl}propanoyloxy]ethylmethacrylate, 2-[3-{2-(6-hydroxybenzo[1,3]dioxol-5-yl)-2H-benzotriazole-5-yl}propanoyloxy]ethylacrylate, 4-[3-{2-(6-hydroxybenzo[1,3]dioxol-5-yl)-2H-benzotriazole-5-yl}propanoyloxy]butylmethacrylate, 4-[3-{2-(6-hydroxybenzo[1,3]dioxol-5-yl)-2H-benzotriazole-5-yl}propanoyloxy]butylacrylate, 2-[3-{2-(6-hydroxybenzo[1,3]dioxol-5-yl)-2H-benzotriazole-5-yl}propanoyloxy]ethylmethacrylate, 2-[3-{2-(6-hydroxybenzo[1,3]dioxol-5-yl)-2H-benzotriazole-5-yl}propanoyloxy]ethylacrylate, 2-(methacryloyloxy)ethyl 2-(6-hydroxybenzo[1,3]dioxol-5-yl)-2H-benzotriazole-5-carboxylate, 2-(acryloyloxy)ethyl 2-(6-hydroxybenzo[1,3]dioxol-5-yl)-2H-benzotriazole-5-carboxylate, 4-(methacryloyloxy)butyl 2-(6-hydroxybenzo[1,3]dioxol-5-yl)-2H-benzotriazole-5-carboxylate, and 4-(acryloyloxy)butyl 2-(6-hydroxybenzo[1,3]dioxol-5-yl)-2H-benzotriazole-5-carboxylate. Additionally, these sesamol type benzotriazole monomers may be used individually or in combination of two or more.

In cases were the above-described sesamol type benzotriazole monomer is contained in the hard coat layer 12, the above-described sesamol type benzotriazole monomer is preferably contained in the hard coat layer 12, for example, at a content of 15 to 30% by mass. The presence of the sesamol type benzotriazole monomer in such a content range allows the resin layer to achieve the above-described spectral transmittance. In the hard coat layer 12, the above-described sesamol type benzotriazole monomer may react with a resin component included in the hard coat layer 12 to be contained as an integrated part of the resulting compound, or may be contained individually without reacting with a resin component included in the hard coat layer 12.

«Inorganic Layer»

The inorganic layer 13 is a layer composed mainly of an inorganic substance, and, for example, a layer containing 55% by mass or more of inorganic substance falls under an inorganic layer. The inorganic layer 13 may contain an organic component, but is preferably composed only of an inorganic substance. Whether a layer in contact with the hard coat layer 12 falls under an inorganic layer can be checked by X-ray photoelectron spectroscopy (X-Ray Photoelectron Spectroscopy: XPS or Electron Spectroscopy for Chemical Analysis: ESCA).

Examples of constituent materials for the inorganic layer 13 include: metals such as Ti, Al, Mg, and Zr; inorganic oxides such as silicon oxide ($SiO_x$ (x=1 to 2)), aluminum oxide, silicon oxynitride, aluminum oxynitride, magnesium oxide, zinc oxide, indium oxide, tin oxide, and yttrium oxide; inorganic nitrides; diamondlike carbon; and the like. Among these, silicon oxide is preferable in terms of enhancing transmittance and enhancing scratch resistance.

The inorganic layer 13 preferably contains silicon. The inorganic layer 13 containing silicon makes it possible to seek a lower refractive index. Whether the inorganic layer contains silicon can be checked by X-ray photoelectron spectroscopy (X-Ray Photoelectron Spectroscopy: XPS or Electron Spectroscopy for Chemical Analysis: ESCA).

The inorganic layer 13 preferably has a film thickness of 10 nm or more and 300 nm or less. The inorganic layer 13 having a film thickness of 10 nm or more imparts excellent scratch resistance, and 300 nm or less allows the adhesiveness to another layer to be favorable without affecting the bendability and optical properties. As the lower limit of the film thickness of the inorganic layer 13, 30 nm or more, 50 nm or more, or 80 nm or more is preferable in this order (the larger the value, the more preferable), and as the upper limit, 250 nm or less, 200 nm or less, or 150 nm or less is preferable in this order (the smaller the value, the more preferable). The film thickness of the inorganic layer 13 should be determined in the same manner as the film thickness of the hard coat layer 12.

The inorganic layer 13 preferably has a water vapor transmission rate (WVTR: Water Vapor Transmission Rate) of 100 g/(m²·24 h) or less at 40° and a relative humidity of 90%. The folding resistance is more degraded as the temperature is higher and as the relative humidity is higher. This is considered to be because water penetrates the inorganic layer 13, and because the penetrating water causes the hard coat layer to be hydrolyzed. Allowing the water vapor transmission rate of the inorganic layer 13 to be 100 g/(m²·24 h) or less can decrease the amount of water penetrating the inorganic layer 13, and thus, can inhibit the hard coat layer from being hydrolyzed. The water vapor transmission rate is a value obtained by a technique in accordance with JIS K7129: 2008. The water vapor transmission rate can be measured using a water vapor transmission rate measurement device (product name "PERMA- TRAN-W3/31", manufactured by MOCON). The arithmetic mean of three measurements is determined as the water vapor transmission rate.

The inorganic layer 13 can be formed, for example, by a vapor deposition method such as PVD or CVD. Examples of PVD methods include vacuum vapor deposition, sputtering, ion plating, and the like. Examples of vacuum vapor deposition methods include vacuum vapor deposition based on an electron beam (EB) heating method, vacuum vapor deposition based a high-frequency dielectric heating method, and the like.

«Functional Layer»

The functional layer 14 is a layer which carries out a function in the optical film 10, and examples of the functional layer 14 include an optical adjustment layer, an antistatic layer, and the like. In this regard, the functional layer 14 may carry out two or more functions. For example, the functional layer 14 may be a layer which carries out both of an optical adjustment function and an antistatic function.

The functional layer 14 preferably has a film thickness of 30 nm or more and 200 nm or less. The functional layer 14 having a film thickness of 30 nm or more makes it possible to achieve sufficient adhesiveness between the hard coat layer 12 and the optical adjustment layer 14, and 200 nm or less makes it possible to inhibit interference fringes better. As the lower limit for the functional layer 14, 50 nm or more, 70 nm or more, or 90 nm or more is preferable in this order (the larger the value, the more preferable), and as the upper limit, 150 nm or less, 140 nm or less, or 130 nm or less is preferable in this order (the smaller the value, the more preferable). The film thickness of the functional layer 14 should be determined in the same manner as the film thickness of the hard coat layer 12.

<Optical Adjustment Layer>

In general, a resin included in a bendable light-transmitting base material has a high refractive index, and the light-transmitting base material and the hard coat layer accordingly have a large difference in refractive index therebetween. Because of this, the difference in refractive index between the light-transmitting base material and the hard coat layer will undesirably cause interference fringe which exhibits iridescent nonuniformity. An optical adjustment layer is a layer for inhibiting the generation of interference fringe. The refractive index of the optical adjustment layer is preferably lower than that of the light-transmitting base material 11 and higher than that of the hard coat layer 12, in terms of inhibiting the generation of interference fringe. The refractive index of the optical adjustment layer can be measured, for example, by the Becke method. In measuring the refractive index of the optical adjustment layer in accordance with the Becke method, 10 fragments are cut out from an optical adjustment layer, the 10 cut fragments are each measured for refractive index using a refractive index standard liquid in accordance with the Becke method, and the average value of the 10 refractive index measurements of the fragments is regarded as the refractive index of the optical adjustment layer. The refractive index of the light-transmitting base material 11 and that of the hard coat layer 12 can be measured in the same manner as that of the optical adjustment layer.

The refractive index difference between the optical adjustment layer and the hard coat layer 12 (the refractive index of the optical adjustment layer—the refractive index of the hard coat layer) is preferably 0.005 or more and 0.100 or less. This refractive index difference of 0.005 or more causes interfacial reflection between the optical adjustment layer and the hard coat layer 12, but the interfacial reflection can be controlled at a level which causes no visible interference fringe, and 0.100 or less causes slight visible interference fringe, but the interference fringe can be controlled at a level which is not problematic for practical usage. The lower limit of the refractive index difference is more preferably 0.007 or more, while the upper limit is more preferably 0.090 or less. The refractive index of the optical adjustment layer may be 0.010 or more and 0.080 or less.

The optical adjustment layer may be composed only of a resin, but preferably contains a binder resin and particles for adjustment of the refractive index. Additionally, the optical adjustment layer may further contain an antistatic agent to exert an antistatic function besides the optical adjustment function. The binder resin for the optical adjustment layer is preferably at least one resin selected from the group consisting of (meth)acrylic resins, cellulose resins, urethane resins, vinyl chloride resins, polyester resins, polyolefin resins, polycarbonate, nylon, polystyrene, and ABS resins. The particles for the optical adjustment layer 14 are preferably at least one selected from the group consisting of: low refractive index particles such as of silica or magnesium fluoride; metal oxide particles such as of titanium oxide or zirconium oxide; inorganic pigments such as cobalt blue; and the like. Among these, a combination of a polyester resin and metal oxide particles such as of titanium oxide or zirconium oxide is more preferable in terms of adjusting adhesiveness and refractive index difference.

<Antistatic Layer>

The antistatic layer contains an antistatic agent. Examples of antistatic agents include an ionic conductive antistatic agent and an electronic conductive antistatic agent, and an ionic conductive antistatic agent is preferable in terms of compatibility with binder resins.

Examples of the ionic conductive antistatic agent include: cationic antistatic agents such as quaternary ammonium salts and pyridium salts; anionic antistatic agents such as alkali metal salts (for example, lithium salts, sodium salts, potassium salts, and the like) such as of sulfonic acid, phosphoric acid, and carboxylic acid; amphoteric antistatic agents such as amino acid-based and amino acid sulfate-based ones; nonionic antistatic agents such as aminoalcohol-based, glycerin-based, and polyethylene glycol-based ones; and the like. Among these, quaternary ammonium salts and lithium salts are preferable in terms of exhibiting excellent compatibility with binder resins.

Examples of the electronic conductive antistatic agent include: electroconductive polymers such as polyacetylene-based and polythiophene-based ones; electroconductive particles such as metal particles and metal oxide particles. Among these, preferable ones are: antistatic agents obtained by combining a dopant with an electroconductive polymer such as polyacetylene or polythiophene; metal particles; and metal oxide particles. The electroconductive polymer is also allowed to contain electroconductive particles.

Specific examples of the antistatic agent composed of an electroconductive polymer include electroconductive polymers such as polyacetylene, polyaniline, polythiophene, polypyrrole, polyphenylene sulfide, poly(1,6-heptadiyne), polybiphenylene (polyparaphenylene), polyparaphinylene sulfide, polyphenyl acetylene, poly(2,5-thienylene), and derivatives thereof. Preferable examples include polythiophene-based electroconductive organic polymers (for example, 3,4-ethylenedioxythiophene (PEDOT)).

Use of the antistatic agent composed of an electroconductive organic polymer affords low humidity dependence to maintain an antistatic property for a long period of time; additionally, makes it possible to achieve high transparency and a low haze value; and furthermore, affords significantly enhanced hard coat properties, particularly high pencil hardness, scratch resistance to steel wool, and the like.

Examples of metals included in the metal particles include, but are not particularly limited to: Au, Ag, Cu, Al, Fe, Ni, Pd, Pt, and the like used singly; and alloys of these metals. Additionally, examples of metal oxides included in the metal oxide particles include, but are not particularly limited to, tin oxide ($SnO_2$), antimony oxide ($Sb_2O_5$), antimony-doped tin oxide (ATO), tin-doped indium oxide (ITO), aluminum-doped zinc oxide (AZO), fluorine-doped tin oxide (FTO), zinc oxide (ZnO), and the like.

The antistatic agent content is not limited to a particular value, but is preferably 1 part by mass or more and 50 parts by mass or less relative to 100 parts by mass of polymerizable compound in the antistatic layer composition. The amount of 1 part by mass or more allows the above-described antistatic property to be sufficient, and 50 parts by mass or less makes it possible to obtain a highly transparent film having a small haze value and favorable total light transmittance. The lower limit of the antistatic agent content is more preferably 10 parts by mass or more, while the upper limit is more preferably 40 parts by mass or less.

«Optical Film Production Method»

The optical film 10 can be produced, for example, as follows. First, a functional layer composition for forming a functional layer 14 is applied on one surface of the light-transmitting base material 11 with a coating apparatus such as a bar coater to form a coating film of the functional layer composition. Here, the functional layer composition is an optical adjustment layer composition, but may also be an antistatic layer composition.

<Functional Layer Composition>

The functional layer composition contains a binder resin precursor, particles of metal oxide or the like, and a solvent. If necessary, the functional layer composition may contain at least one of: low refractive index particles such as of silica or magnesium fluoride; inorganic pigments such as cobalt blue; leveling agents; and polymerization initiators. In cases where a polyester resin is used as the binder resin precursor, the functional layer composition may additionally contain, if necessary, one or more resins selected from the group consisting of (meth)acrylic resins, cellulose resins, urethane resins, vinyl chloride resins, polyolefin resins, polycarbonate, nylon, polystyrene, and ABS resins.

After the coating film of the functional layer composition is formed, the coating film is heated and dried, for example, at a temperature of 40° C. or higher and 200° C. or lower for a period of 10 seconds to 120 seconds by various known techniques to evaporate the solvent or cure the coating film. If necessary, the coating film is also exposed to ionizing radiation such as ultraviolet light to form a functional layer 14.

After the functional layer 14 is formed, a hard coat layer composition for forming a hard coat layer 12 is applied on the functional layer 14 with a coating apparatus such as a bar coater to form a coating film of the hard coat layer composition.

<Hard Coat Layer Composition>

The hard coat layer composition contains: a polymerizable compound which is cured to become a binder resin 12A; and inorganic particles 12B. The hard coat layer composition may additionally contain an ultraviolet absorber, a spectral transmittance modifier, a leveling agent, a solvent, and a polymerization initiator, as necessary.

(Solvent)

Examples of the above-described solvent include alcohols (for example, methanol, ethanol, propanol, isopropanol, n-butanol, s-butanol, t-butanol, benzyl alcohol, PGME, ethylene glycol, diacetone alcohol), ketones (for example, acetone, methyl ethyl ketone, methyl isobutyl ketone, cyclopentanone, cyclohexanone, heptanone, diisobutyl ketone, diethyl ketone, diacetone alcohol), esters (methyl acetate, ethyl acetate, butyl acetate, n-propyl acetate, isopropyl acetate, methyl formate, PGMEA), aliphatic hydrocarbons (for example, hexane, cyclohexane), halogenated hydrocarbons (for example, methylene chloride, chloroform, carbon tetrachloride), aromatic hydrocarbons (for example, benzene, toluene, xylene), amides (for example, dimethylformamide, dimethylacetamide, n-methylpyrrolidone), ethers (for example, diethyl ether, dioxane, tetrahydrofurane), ether alcohols (for example, 1-methoxy-2-propanol), and carbonates (dimethyl carbonate, diethyl carbonate, ethylmethyl carbonate). These solvents may be used individually or in combination of two or more. Among those solvents, methyl isobutyl ketone and methyl ethyl ketone are preferred as the above-described solvent in terms of the ability to dissolve or disperse components such as urethane (meth)acrylate and other additives and thereby to apply the above-described resin layer composition in a suitable manner.

(Polymerization Initiator)

The polymerization initiator is a component which degrades, when exposed to ionizing radiation or heat, and generates radicals to initiate or promote polymerization (cross-linking) of a polymerizable compound.

The polymerization initiator is not limited to a particular polymerization initiator as long as it can generate a substance that initiates a radical polymerization by exposure to ionizing radiation or heat. Any known polymerization initiator can be used without any particular limitation, and specific examples include acetophenones, benzophenones, Michler's benzoyl benzoate, α-amyloxime esters, thioxantones, propyophenones, benzyls, benzoins, and acylphosphine oxides. Additionally, a photosensitizer is preferably mixed for use, and specific examples of the photosensitizer include n-butylamine, triethylamine, and poly-n-butylphosphine.

After the coating film of the hard coat layer composition is formed, the coating film is heated and dried at a temperature of, for example, 30° C. or higher and 120° C. or lower for a period of 10 seconds to 120 seconds by various known techniques to evaporate the solvent.

The coating film is dried and then cured by exposure to ionizing radiation such as ultraviolet light to form a hard coat layer 12.

After the hard coat layer 12 is formed, an inorganic layer 13 is formed so as to be in contact with the hard coat layer 12 using a vapor deposition method such as sputtering. Consequently, the optical film 10 shown in FIG. 1 is obtained.

«<Image Display Device»>

Figure 4:
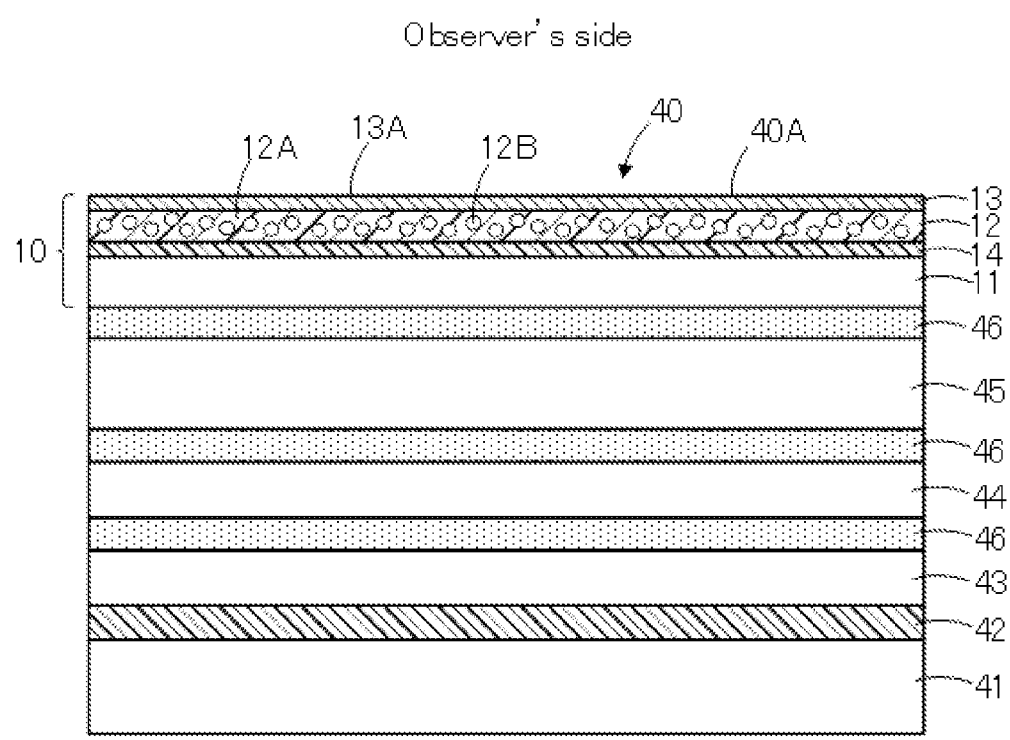
FIG. 4 depicts the schematic diagram of an image display device according to the first embodiment.

The optical film 10 may be incorporated into a foldable image display device and then used. FIG. 4 depicts the schematic diagram of the image display device according to the present embodiment. As shown in FIG. 4, a housing 41 for housing a battery and the like, a protective film 42, a display panel 43, a touch sensor 44, a circularly polarizing plate 45, and the optical film 10 are mainly laminated in this order toward the observer in the image display device 40. A light-transmitting adhesive 46 such as, for example, OCA (optical clear adhesive) is placed along the interfaces between the display panel 43 and the touch sensor 44, between the touch sensor 44 and the circularly polarizing plate 45, and between the circularly polarizing plate 45 and the optical film 10, and these members are fixed to each other with the light-transmitting adhesive 46.

In the optical film 10, the hard coat layer 12 is located on the observer's side of the light-transmitting base material 11. For the image display device 40, the surface 10A of the optical film 10 is configured to be the surface 40A of the image display device 40.

In the image display device 40, the display panel 43 is an organic light emitting diode panel containing an organic light emitting diode and the like. The touch sensor 44 is located closer to the display panel 43 than the circularly polarizing plate 45 but may be placed between the circularly polarizing plate 45 and the optical film 10. Additionally, the touch sensor 44 may be an on-cell type or an in-cell type.

The present inventors have vigorously made studies on the scratch resistance of an optical film in which an inorganic layer is formed on a hard coat layer, and have discovered that the scratch resistance can be enhanced by allowing the hard coat layer to contain inorganic particles, allowing the hard coat layer to have a film thickness of 1 μm or more, and allowing the hard coat layer to have an indentation hardness of 200 MPa or more. This is considered to be because blending a suitable hard coat layer with suitable inorganic particles has made it possible to ensure firm adhesiveness to an inorganic layer and enabled the hard coat layer to achieve higher hardness. The present embodiment allows the hard coat layer 12 containing the binder resin 12A and the inorganic particles 12B to have a film thickness of 1 μm or more and allows the hard coat layer 12 to have an indentation hardness of 200 MPa or more, and thus, can provide the optical film 10 having excellent scratch resistance.

When the surface of the hard coat layer is subjected to a steel wool test, the inorganic particles tend to fall off. Because of this, it is considered to be preferable, in terms of enhancing scratch resistance, that the hard coat layer does not contain inorganic particles, but in the present embodiment, the inorganic layer 13 is formed on the hard coat layer 12, thus making it possible to inhibit the inorganic particles 12B in the hard coat layer 12 from falling off in a steel wool test. Thus, containing the inorganic particles 12 makes it possible to enhance the hardness of the hard coat layer 12 and enhance the scratch resistance.

Second Embodiment

Figure 5:
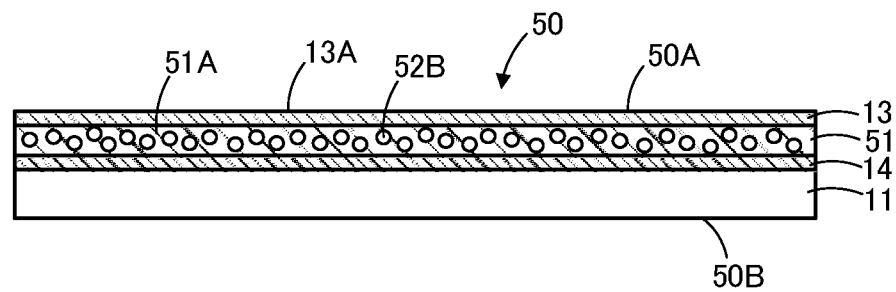
FIG. 5 depicts the schematic diagram of an optical film according to the second embodiment.

An optical film, a laminate, a polarizing plate and an image display device according to the second embodiment of the present invention are now described with reference to the drawings. FIG. 5 depicts the schematic diagram of the polarizing plate in which the optical film according to the present embodiment is incorporated. In FIG. 5, the elements indicated by the same reference numbers as in FIG. 1 are the same as those indicated in FIG. 1, and further description is thus omitted.

«<Optical Film>»

The optical film 50 shown in FIG. 5 includes a light-transmitting base material 11, a hard coat layer 51, and an inorganic layer 13 in this order in the same manner as the optical film 10. In FIG. 5, the surface 50A of the optical film 50 corresponds to the surface 13A of the inorganic layer 13, and the back surface 50B corresponds to the opposite surface of the light-transmitting base material 11 from the hard coat layer 51 side. The physical properties of the optical film 50 are the same as those of the optical film 10, and the description thereof is thus omitted here.

«Hard Coat Layer»

The hard coat layer 51 has an indentation hardness of 200 MPa or more for the same reason as described in the section on the hard coat layer 12, and also has a film thickness of 1 μm or more. The preferable upper limit and lower limit of the indentation hardness and film thickness of the hard coat layer 51 are the same as the preferable upper limit and lower limit of the indentation hardness and film thickness of the hard coat layer 12. The physical properties and the like of the hard coat layer 51 are the same as those of the hard coat layer 12, and the description thereof is thus omitted here.

The hard coat layer 51 contains at least one of a metallic element and a metalloid element. The hard coat layer 51 containing at least one of a metallic element and a metalloid element makes it possible to enhance the adhesiveness to the inorganic layer 13 and thus enhance scratch resistance. The metallic element may be any of typical metallic elements such as aluminum and tin and transition metallic elements such as zirconium and titanium. Additionally, examples of metalloid elements include boron, silicon, germanium, arsenic, antimony, tellurium, and the like. Whether the hard coat layer contains any of the elements can be checked by the following method. First, a piece having a size of 1 mm×6 mm was cut out from an optical film, and the piece was cut at an angle of 2° or less with the plane using a microtome (product name "Ultramicrotome EM UC7"; manufactured by Leica Microsystems GmbH) so as to have a film thickness equal to or greater than the film thickness of the inorganic layer and to expose the hard coat layer. Then, an X-ray photoelectron spectroscope (ESCA, product name "KRATOS Nova"; manufactured by Shimadzu Corporation) is used to carry out elemental analysis on the surface obtained by cutting as above-described. This makes it possible to check whether the hard coat layer contains at least one of a metallic element and a metalloid element.

The atomic ratio of the total of the metallic element and the metalloid element contained in the hard coat layer 51 is preferably 1.5% or more and 30% or less as measured by X-ray photoelectron spectroscopy. Allowing the atomic ratio of the total of the metallic element and the metalloid element to be 1.5% or more makes it possible to enhance the adhesiveness to the inorganic layer 13, and additionally, 30% or less makes it possible to maintain the bendability. The atomic ratio of the total of the metallic element and the metalloid element should be measured using an X-ray photoelectron spectroscope (ESCA, product name "KRATOS Nova"; manufactured by Shimadzu Corporation) on the surface obtained by cutting for the purpose of carrying out the elemental analysis. The lower limit of the atomic ratio of the total amount of the metallic element and the metalloid element in the hard coat layer 51 is 2% or more, more preferably 5% or more, (the larger the value, the more preferable), and the upper limit is 25% or less, more preferably 20% or less, (the smaller the value, the more preferable).

The hard coat layer 51 preferably contains a silicone resin 51A and inorganic particles 51B in terms of further enhancing scratch resistance. However, the hard coat layer 51 does not have to contain both the silicone resin 51A and the inorganic particles 51B if the hard coat layer 51 contains at least one of a metallic element and a metalloid element. For example, in cases where the hard coat layer contains a silicone resin, the hard coat layer contains silicon derived from the silicone resin, and accordingly, does not have to contain the inorganic particles 51B. In cases where the hard coat layer contains silica particles as inorganic particles, the hard coat layer contains silicon derived from the silica particles, and accordingly, does not have to contain a silicone resin. As used herein, a "silicone resin" means a polymer compound having a main backbone formed with a siloxane bond (a bond between silicon and oxygen). The hard coat layer 51 may contain an additive such as an ultraviolet absorber or a spectral transmittance modifier in addition to the silicone resin 51A and inorganic particles 51B.

<Silicone Resin>

The silicone resin 51A is preferably a polymer (cured product) of a polymerizable compound containing silsesquioxane represented by the general formula $(R^9SiO_{1.5})_n$ having a polymerizable functional group. In the formula, $R^9$ is a polymerizable functional group such as a radical polymerizable functional group or a cationic polymerizable functional group, and n is an integer of 1 or greater. The polymerizable compound may contain another polymerizable compound in addition to the silsesquioxane, and may also be the silsesquioxane alone. The silicone resin 51A contains such a polymer of a polymerizable compound containing silsesquioxane, resulting in making it possible to have firm adhesiveness to the inorganic layer. Examples of radical polymerizable functional groups include ethylenic unsaturated groups such as a (meth)acryloyl group, vinyl group, and allyl group, and examples of cationic polymerizable functional groups include an epoxy group and an oxetanyl group. Containing such a radical polymerizable functional group and a cationic polymerizable functional group enables the silsesquioxanes to link therebetween, making it possible to obtain a polymer.

Examples of structures of silsesquioxane include, but are not particularly limited to: cage structures such as a complete cage structure and an incomplete cage structure; a ladder structure; a random structure; and the like, and may be any of these structures. Examples of commercially available silsesquioxane include Glycidyl polysilsesquioxane cage mixture manufactured by Construe Chemical Co., Ltd. and photo-curable SQ series manufactured by Toagosei Co., Ltd.

The polymerizable compound for forming the silicone resin 51A may contain, instead of the silsesquioxane, the following: dimethylpolysiloxane having a radical polymerizable functional group such as a (meth)acryloyl group; a silicone oligomer having an alkoxysilyl group; and/or a silicone polymer. The silicone oligomer and silicone polymer preferably have a polymerizable functional group such as a radical polymerizable functional group or a cationic polymerizable functional group in terms of enabling the hardness of the hard coat layer to be further enhanced.

Examples of commercially available dimethylpolysiloxane having a radical polymerizable functional group include the KR series manufactured by Shin-Etsu Chemical Co., Ltd., for example, KP-410, KP-411, KP-412, KP-413, KP-414, KP-415, KP-423 (which are all of a dual-end type), KP-416, KP418, KP-422 (which are all of a single-end type), and KP-420 (which is of a side chain type).

Examples of commercially available silicone oligomers having an alkoxysilyl group include: KR-500, KR-515, KC-895, and X-40-9225 manufactured by Shin-Etsu Chemical Co., Ltd.; and the like. Additionally, examples of ultra-high molecular weight silicone resins include: KR-251 manufactured by Shin-Etsu Chemical Co., Ltd.; and the like.

<Inorganic Particles>

The inorganic particles 51B are the same as the inorganic particles 12B described in the first embodiment, and the description is thus omitted here.

The present inventors have vigorously made studies on the scratch resistance of an optical film in which an inorganic layer is formed on a hard coat layer, and have discovered that the scratch resistance can be enhanced by allowing the hard coat layer to contain at least one of a metallic element and a metalloid element, allowing the hard coat layer to have a film thickness of 1 μm or more, and allowing the hard coat layer to have an indentation hardness of 200 MPa or more. This is considered to be because allowing the hard coat layer to contain at least one of a metallic element and a metalloid element has made it possible to ensure firm adhesiveness to an inorganic layer and enabled the hard coat layer to achieve higher hardness. The present embodiment allows the hard coat layer 51 containing at least one of a metallic element and a metalloid element to have a film thickness of 1 μm or more and allows the hard coat layer 51 to have an indentation hardness of 200 MPa or more, and thus, can provide the optical film 50 having excellent scratch resistance.

When the surface of the hard coat layer is subjected to a steel wool test, the inorganic particles tend to fall off. Because of this, it is considered to be preferable, in terms of enhancing scratch resistance, that the hard coat layer does not contain inorganic particles, but in the present embodiment, the inorganic layer 13 is formed on the hard coat layer 51, thus making it possible to inhibit the inorganic particles 51B in the hard coat layer 51 from falling off in a steel wool test. Thus, containing the inorganic particles 51B makes it possible to enhance the hardness of the hard coat layer 51 and enhance the scratch resistance.

«<Image Display Device»>

Figure 6:
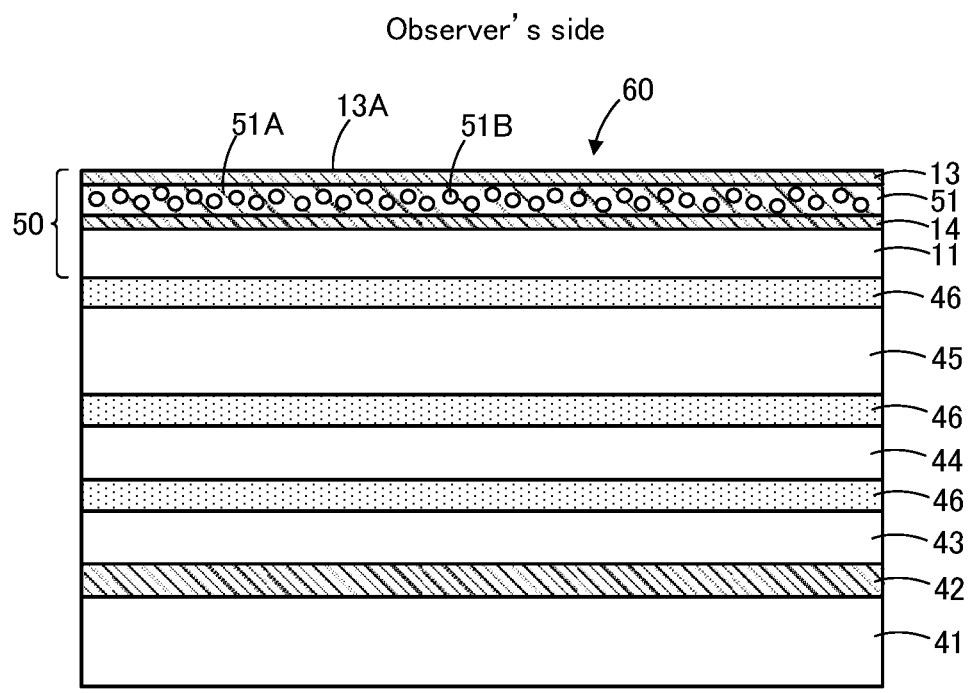
FIG. 6 depicts the schematic diagram of an image display device according to the second embodiment.

The optical film 50 may be incorporated into a foldable image display device and then used. FIG. 6 depicts the schematic diagram of the image display device according to the present embodiment. The image display device 60 shown in FIG. 6 includes an optical film 50. The image display device 60 is the same as the image display device 40 except that the optical film 10 is replaced with the optical film 50, and the description thereof is thus omitted here.

EXAMPLES

Now, the present invention will be described in more detail by way of Examples. However, the present invention is not limited to those Examples. The phrase "a converted value based on 100% solids" below means a value determined based on the assumption that the content of solids diluted in a solvent is 100%.

<Preparation of Hard Coat Layer Compositions>

First, the following components were combined to meet the composition requirements indicated below and thereby obtain hard coat layer compositions.

(hard Coat Layer Composition 1)

Polyester acrylate (product name "M-9050"; manufactured by Toagosei Co., Ltd.): 50 parts by mass Silica particles (product name "MIBK-SD"; manufactured by Nissan Chemical Industries, Ltd.): 50 parts by mass Polymerization initiator (1-hydroxycyclohexyl phenyl ketone; product name "Irgacure® 184"; manufactured by BASF Japan Ltd.): 5 parts by mass Methyl isobutyl ketone: 100 parts by mass (Hard Coat Layer Composition 2)

Polyester acrylate (product name "M-9050"; manufactured by Toagosei Co., Ltd.): 67 parts by mass Silica particles (product name "MIBK-SD"; manufactured by Nissan Chemical Industries, Ltd.): 33 parts by mass Polymerization initiator (1-hydroxycyclohexyl phenyl ketone; product name "Irgacure® 184"; manufactured by BASF Japan Ltd.): 5 parts by mass Methyl isobutyl ketone: 100 parts by mass (Hard Coat Layer Composition 3)

Polyester acrylate (product name "M-9050"; manufactured by Toagosei Co., Ltd.): 90 parts by mass Silica particles (product name "MIBK-SD"; manufactured by Nissan Chemical Industries, Ltd.): 10 parts by mass Polymerization initiator (1-hydroxycyclohexyl phenyl ketone; product name "Irgacure® 184"; manufactured by BASF Japan Ltd.): 5 parts by mass Methyl isobutyl ketone: 100 parts by mass (Hard Coat Layer Composition 4)

Alkoxylated dipentaerythritol acrylate (product name "A-DPH-12E"; manufactured by Shin-Nakamura Chemical Co., Ltd.): 50 parts by mass Silica particles (product name "MIBK-SD"; manufactured by Nissan Chemical Industries, Ltd.): 50 parts by mass Polymerization initiator (1-hydroxycyclohexyl phenyl ketone; product name "Irgacure® 184"; manufactured by BASF Japan Ltd.): 5 parts by mass Methyl isobutyl ketone: 100 parts by mass (Hard Coat Layer Composition 5)

Glycidyl polysilsesquioxane (product name "Glycidyl polysilsesquioxane cage mixture"; manufactured by Construe Chemical Co., Ltd.): 100 parts by mass Polymerization initiator (tri-p-tolylsulfonium hexafluorophosphate; manufactured by Tokyo Chemical Industry Co., Ltd.): 5 parts by mass 1-methoxy-2-propanol: 100 parts by mass (Hard Coat Layer Composition 6)

Polyester acrylate (product name "M-9050"; manufactured by Toagosei Co., Ltd.): 100 parts by mass Polymerization initiator (1-hydroxycyclohexyl phenyl ketone; product name "Irgacure® 184"; manufactured by BASF Japan Ltd.): 5 parts by mass Methyl isobutyl ketone: 100 parts by mass (Hard Coat Layer Composition 7)

Polypropylene glycol diacrylate (product name "M-220"; manufactured by Toagosei Co., Ltd.): 90 parts by mass Silica particles (product name "MIBK-SD"; manufactured by Nissan Chemical Industries, Ltd.): 10 parts by mass Polymerization initiator (1-hydroxycyclohexyl phenyl ketone; product name "Irgacure® 184"; manufactured by BASF Japan Ltd.): 5 parts by mass Methyl isobutyl ketone: 100 parts by mass <Preparation of Optical Adjustment Layer Compositions>

The following components were combined to meet the composition requirements indicated below and thereby obtain optical adjustment layer compositions.

(Optical Adjustment Layer Composition 1)

Urethane-modified polyester resin (product name "UR-3200"; manufactured by Toyobo Co., Ltd.): 85 parts by mass (a converted value based on 100% solids)

Zirconium oxide (with an average particle diameter of 20 nm; manufactured by CIK NanoTek Corporation): 15 parts by mass (a converted value based on 100% solids)

Methyl isobutyl ketone (MIBK): 170 parts by mass

<Production of Polyimide Base Material>

In a 500 ml separable flask, 278.0 g of dehydrated dimethylacetamide and 8.1 g (33 mmol) of 1,3-bis(3-aminopropyl)tetramethyldisiloxane (AprTMOS) were dissolved to make a solution, which was controlled at a liquid temperature of 30° C., and to the solution, 18.1 g (41 mmol) of 4,4'-(hexafluoroisopropylidene)diphthalic anhydride (6FDA) was gradually added with the temperature rise regulated to 2° C. or less. The resulting mixture was stirred using a mechanical stirrer for one hour. To the resulting solution, 46.1 g (131 mmol) of 2,2'-bis(trifluoromethyl)benzidine (TFMB) was added, followed by verifying that they were completely dissolved, and then 51.8 g (122 mmol) of 4,4'-(hexafluoroisopropylidene)diphthalic anhydride (6FDA) was gradually added in several installments with the temperature rise regulated to 2° C. or less, to synthesize a polyimide precursor solution (1) (having a solid content of 30 wt %) in which a polyimide precursor 1 was dissolved.

The polyimide precursor solution (1) was cooled to room temperature, and to the solution, 196.8 g of dehydrated dimethylacetamide was added. The resulting mixture was stirred so as to be uniform. To the resulting mixture, 128.9 g of (1.63 mol) of pyridine, which was a catalyst, and 167.7 g (1.63 mol) of acetic anhydride were added, and then, the resulting mixture was stirred at room temperature for 24 hours to synthesize a polyimide solution. Into a 5 L separable flask, 400.0 g of the resulting polyimide solution was transferred, 119.2 g of butyl acetate was added to the solution, and the resulting mixture was stirred so as to be uniform. Next, 688.0 g of methanol was gradually added to the resulting mixture to obtain a solution which was slightly turbid. To the turbid solution, 2.064 kg of methanol was added all at once to obtain white slurry. The slurry was filtrated and washed with methanol five times to obtain 65.0 g of polyimide resin (1).

To 42.2 g of butyl acetate, 10.0 g of the polyimide resin (1) was added, and the resulting mixture was stirred at room temperature for one hour to obtain a polyimide solution. The polyimide solution was degassed using a tabletop ultrasonic cleaning device (product name "UT-104"; manufactured by Sharp Corporation) for ten minutes, taken out, and left to stand at room temperature for one hour. The polyimide solution which had been left to stand was applied onto a polyethylene terephthalate (PET) film (product name "LUMIRROR T60"; manufactured by Toray Industries, Inc.) having a thickness of 250 μm, dried in a circulation oven at 40° C. for ten minutes and at 150° C. for ten minutes, then removed from the PET film, and further dried at 150° C. for one hour to obtain a polyimide base material having a size of A5 (148 mm×210 mm) and a thickness of 50 μm. Here, the thickness of the polyimide base material is defined as the arithmetic mean of film thickness values measured at 10 different locations, where a cross-section of the polyimide base material is photographed using a scanning electron microscope (SEM) and the thickness of the polyimide base material is measured at the 10 locations within the image of the cross-section.

Example 1

A polyimide base material having a refractive index of 1.630 and a thickness of 50 μm (product name "Neopulim"; manufactured by Mitsubishi Gas Chemical Company, Inc.) was prepared as a light-transmitting base material, and the hard coat layer composition 1 was applied on a first surface of the polyimide base material with a bar coater to form a coating film. Then, the formed coating film was heated at 70° C. for one minute to evaporate the solvent in the coating film, and was then exposed to ultraviolet light to a cumulative light dose of 200 mJ/cm² in a nitrogen atmosphere with an ultraviolet irradiation device (with an H bulb as a light source; manufactured by Fusion UV Systems Inc.) to be cured and form a hard coat layer having a refractive index of 1.521 and a film thickness of 4 μm. Lastly, an inorganic layer having a film thickness of 100 nm and composed of $SiO_x$ (x=1 to less than 2) was formed on the surface of the hard coat layer by sputtering to obtain an optical film.

The thickness of the polyimide base material is defined as the arithmetic mean of thickness values measured at 10 different locations, where a cross-section of the polyimide base material is photographed using a scanning electron microscope (SEM) and the thickness of the polyimide base material is measured at the 10 locations within the image of the cross-section. The film thickness of the hard coat layer was defined as the arithmetic mean of film thickness values measured at 10 different locations, where a cross-section of the hard coat layer was photographed using a scanning transmission electron microscope (STEM) (product name "S-4800"; manufactured by Hitachi High-Technologies Corporation) and the film thickness of the hard coat layer was measured at the 10 locations within the image of the cross-section. The cross-section of the hard coat layer was photographed in the below-mentioned manner. First of all, a piece of 1 mm×10 mm cut out from the optical film was embedded in an embedding resin to prepare a block, and homogeneous sections having a thickness of 70 nm or more and 100 nm or less and having no openings or the like were cut out from the block according to a commonly used sectioning technique. For the preparation of sections, an "Ultramicrotome EM UC7" (Leica Microsystems GmbH) or the like was used. Then, these homogeneous sections having no openings or the like were used as measurement samples. Subsequently, cross-sectional images of the measurement sample were acquired using a scanning transmission electron microscope (STEM). The cross-sectional images were acquired by setting the detector to "TE," the accelerating voltage to "30 kV," and the emission current to "10 μA" in the STEM observation. The focus, contrast, and brightness were appropriately adjusted at a magnification of 5000 to 200,000 times, so that each layer could be identified by observation. Furthermore, the beam monitor aperture, the objective lens aperture, and the WD were respectively set to "3," "3," and "8 mm," in acquirement of cross-sectional images. The film thickness of the inorganic layer was measured in the same manner as the film thickness of the hard coat layer. The refractive indices of the polyimide base material and the like and the hard coat layer were determined by the Becke method in accordance with the method B in JIS K7142:2008. In determination of the refractive index of the polyimide base material in accordance with the Becke method, 10 fragments were cut out from a polyimide base material, the 10 cut fragments were each measured for refractive index using a sodium D line having a wavelength of 589 nm and a refractive index standard liquid, and the average value of the 10 refractive index measurements of the fragments is regarded as the refractive index of the polyimide base material. The refractive index of the hard coat layer was also determined in accordance with the Becke method in the same manner as the refractive index of the polyimide base material determined in accordance with the above-described Becke method. Also in Examples 2 to 7 and Comparative Examples 1 to 4, the thickness and refractive index of the polyimide base materials and the like were measured by the same methods as in Example 1.

Example 2

In Example 2, an optical film was obtained in the same manner as in Example 1, except that the hard coat layer composition 2 was used instead of the hard coat layer composition 1.

Example 3

In Example 3, an optical film was obtained in the same manner as in Example 1, except that the hard coat layer composition 3 was used instead of the hard coat layer composition 1.

Example 4

In Example 4, an optical film was obtained in the same manner as in Example 1, except that the hard coat layer composition 4 was used instead of the hard coat layer composition 1.

Example 5

In Example 5, an optical film was obtained in the same manner as in Example 1, except that the film thickness of the hard coat layer was 2 μm.

Example 6

In Example 6, an optical film was obtained in the same manner as in Example 1, except that the film thickness of the hard coat layer was 10 μm.

Example 7

In Example 7, an optical film was obtained in the same manner as in Example 1, except that the film thickness of the hard coat layer was 20 μm.

Example 8

A polyimide base material having a refractive index of 1.630 and a thickness of 50 μm (product name "Neopulim"; manufactured by Mitsubishi Gas Chemical Company, Inc.) was prepared as a light-transmitting base material, and the optical adjustment layer composition 1 was applied on a first surface of the polyimide base material with a bar coater to form a coating film. Then, the formed coating film was heated at 90° C. for one minute to evaporate the solvent in the coating film to form an optical adjustment layer having a refractive index of 1.562 and a film thickness of 100 nm. After the formation of the optical adjustment layer, the hard coat layer composition 1 was applied on the surface of the optical adjustment layer with a bar coater to form a coating film. Then, the formed coating film was heated at 70° C. for one minute to evaporate the solvent in the coating film, and was then exposed to ultraviolet light to a cumulative light dose of 200 mJ/cm² in a nitrogen atmosphere with an ultraviolet irradiation device (with an H bulb as a light source; manufactured by Fusion UV Systems Inc.) to be cured and form a hard coat layer having a refractive index of 1.521 and a film thickness of 4 μm. Lastly, an inorganic layer having a film thickness of 100 nm and composed of $SiO_x$ (x=1 to less than 2) was formed on the surface of the hard coat layer by sputtering to obtain an optical film. The film thickness of the optical adjustment layer was defined as the arithmetic mean of thickness values measured at 10 different locations, where a cross-section of the optical adjustment layer was photographed using a scanning transmission electron microscope (STEM) (product name "S-4800"; manufactured by Hitachi High-Technologies Corporation) and the thickness of the optical adjustment layer was measured at the 10 locations within the image of the cross-section. The film thickness of the optical adjustment layer was measured in the same manner as the film thickness of the hard coat layer. Additionally, the refractive index of the optical adjustment layer was determined by the Becke method in accordance with the method B in JIS K7142:2008 in the same manner as that of the polyimide base material and the like.

Example 9

In Example 9, an optical film was obtained in the same manner as in Example 1, except that the polyimide base material 1 produced above method was used instead of a polyimide base material (product name "Neopulim"; manufactured by Mitsubishi Gas Chemical Company, Inc.).

Example 10

In Example 10, an optical film was obtained in the same manner as in Example 1, except that the hard coat layer composition 5 was used instead of the hard coat layer composition 1.

Comparative Example 1

In Comparative Example 1, an optical film was obtained in the same manner as in Example 1, except that the hard coat layer composition 6 was used instead of the hard coat layer composition 1.

Comparative Example 2

In Comparative Example 2, an optical film was obtained in the same manner as in Example 1, except that the hard coat layer composition 7 was used instead of the hard coat layer composition 1.

Comparative Example 3

In Comparative Example 3, an optical film was obtained in the same manner as in Example 1, except that the film thickness of the hard coat layer was 0.8 μm.

<Measurement of Indentation Hardness>

The indentation hardness of the hard coat layer of the optical film according to each of Examples and Comparative Examples was measured. Specifically, a piece having a size of 1 mm×10 mm was cut out from the optical film and embedded in an embedding resin to prepare a block, and homogeneous sections having a thickness of 70 nm or more and 100 nm or less and having no openings or the like were cut out from the block according to a commonly used sectioning technique. For the preparation of sections, an "Ultramicrotome EM UC7" (Leica Microsystems GmbH) was used. Then, the block remaining after cutting out the homogeneous sections having no openings or the like was used as a measurement sample. Subsequently, a Berkovich indenter (a trigonal pyramid, TI-0039, manufactured by BRUKER Corporation) as the above-described indenter was pressed perpendicularly into the cross-section of the hard coat layer in the cross-section of the measurement sample obtained after cutting out the sections, wherein the indenter was pressed up to the maximum pressing load of 500 μN over 25 seconds under the below-mentioned measurement conditions. Here for the optical film according to each of Examples 1 to 7, 9, and 10 and Comparative Examples 1 to 3, a Berkovich indenter was pressed into a part of the hard coat layer in order to avoid the influence of the polyimide base material and the inorganic layer and avoid the influence of the side edges of the hard coat layer, wherein the part is 500 nm away into the central side of the hard coat layer from the interface between the polyimide base material and the hard coat layer, 500 nm away into the central side of the hard coat layer from the interface between the hard coat layer and the inorganic layer, and 500 nm away into the central side of the hard coat layer from both side edges of the hard coat layer. For the same reason, a Berkovich indenter was pressed into a part of the hard coat layer in the optical film according to Example 8, wherein the part is 500 nm away into the central side of the hard coat layer from the interface between the optical adjustment layer and the hard coat layer, 500 nm away into the central side of the hard coat layer from the interface between the hard coat layer and the inorganic layer, and 500 nm away into the central side of the hard coat layer from both side edges of the hard coat layer. Subsequently, the intender was held at the position for a certain period of time to relax the residual stress, and then unloaded over 25 seconds to measure the maximum load after the relaxation, and the maximum load $P_{max}$ (μN) and the contact projection area $A_p$ (nm$^2$) are used to calculate an indentation hardness from the value of $P_{max}/A_p$. The contact projection area was a contact projection area, for which the tip curvature of the indenter was corrected using fused quartz (5-0098, manufactured by BRUKER) as a standard sample in accordance with the Oliver-Pharr method. The arithmetic mean of the measurements at 10 different locations was determined as the indentation hardness ($H_{IT}$). In cases where the measurement values included a value deviating ±20% or more from the arithmetic mean value, the deviating value was excluded, followed by remeasurement.

(Measurement Conditions)
  loading speed: 20 μN/second;
  retention time: 5 seconds;
  unloading speed: 20 μN/second;
  measurement temperature: 25° C.

<Check on Presence of Metallic Element and Metalloid Element, and Measurement of Atomic Ratio of Total Amount of these Elements>

A check was made on whether at least one of a metallic element and a metalloid element was present in the hard coat layer of the optical film according to each of Examples and Comparative Examples. Specifically, a piece having a size of 1 mm×6 mm was first cut out from the optical film, and the piece was cut by approximately 200 nm in parallel with the plane using a microtome (product name "Ultramicrotome EM UC7"; manufactured by Leica Microsystems GmbH) to expose the hard coat layer. Then, an X-ray photoelectron spectroscope (ESCA, product name "KRATOS Nova"; manufactured by Shimadzu Corporation) was used to carry out elemental analysis on the surface obtained by cutting as above-described, whereby a check was made on whether the hard coat layer contained at least one of a metallic element and a metalloid element. When this was carried out, the atomic ratio (%) of the total amount of the metallic element and the metalloid element was also measured, using an X-ray photoelectron spectroscope (ESCA, product name "KRATOS Nova"; manufactured by Shimadzu Corporation), on the surface obtained by cutting as above-described.

(Measurement Conditions)
measurement technique: WideNarrow
X-ray source: monochrome AlKα
X-ray output: 150 W
emission current: 10 mA
accelerating voltage: 15 kV
charge-neutralization mechanism: ON
measurement region: 300×700 μm
Pass Energy (Survey): 160 eV
Pass Energy (Narrow): 40 eV <Area Ratio of Silica Particles>

For the optical film according to each of Examples and Comparative Examples, the area ratio of the inorganic particles was determined in the interfacial region up to a depth of 500 nm into the hard coat layer from the interface between the hard coat layer and the inorganic layer in the cross-section of the hard coat layer in the film thickness direction. The area ratio of the inorganic particles in the interfacial region was determined as below-mentioned. First of all, a piece of 1 mm×10 mm cut out from the optical film was embedded in an embedding resin to prepare a block, and 10 homogeneous sections having a thickness of 70 nm or more and 100 nm or less and having no openings or the like were cut out from the block according to a commonly used sectioning technique. For the preparation of sections, an "Ultramicrotome EM UC7" (Leica Microsystems GmbH) was used. Then, these 10 homogeneous sections having no openings or the like were used as measurement samples. Then, the cross-sectional image of each measurement sample was acquired using a scanning transmission electron microscope (STEM) (product name "S-4800"; manufactured by Hitachi High-Technologies Corporation). Here, the cross-section of one part per measurement sample was photographed. The cross-sectional images were acquired by setting the detector to "TE," the accelerating voltage to "30 kV," and the emission current to "10 μA" in the observation. The focus, contrast, and brightness were appropriately adjusted at a magnification of 5000 to 200,000 times, so that each layer could be identified by observation. Furthermore, the beam monitor aperture, the objective lens aperture, and the WD were respectively set to "3," "3," and "8 mm," in acquirement of cross-sectional images. Assuming that the area of the interfacial region was 100% in each of the obtained 10 cross-sectional images, the ratio (area ratio) of the area of the inorganic particles to the area of the interfacial region was determined. The area ratio of the inorganic particles to the interfacial region was the arithmetic mean value of the area ratios of the organic particles determined from the 10 cross-sectional images of the interfacial regions.

<Scratch Resistance>

The surface (surface of the inorganic layer) of the optical film according to each of Examples and Comparative Examples was evaluated by carrying out a steel wool test on the surface. Specifically, a piece having a size of 50 mm×100 mm was cut out from the optical film and fixed on a glass plate with Cello-tape®, manufactured by Nichiban Co., Ltd., so as to generate no fold or wrinkle and to have the inorganic layer on the upper side. A steel wool test was carried out, in which the fixed piece was rubbed with steel wool with a grade of #0000 (product name "Bonstar"; manufactured by Nihon Steel Wool Co., Ltd.) by reciprocating the steel wool with a load of 1 kg/cm² for 10 times at a speed of 50 mm/second, and the resulting surface of the optical film was visually checked for any scratch. The evaluation criteria were as below-mentioned.

○: no scratch or chip was found, or a few scratches or chips were found but at a level which was not problematic for practical usage.

x: some clear scratches or chips were found.

<Measurement of Haze>

The haze value (total haze value) of the optical film according to each of Examples and Comparative Examples was measured. The haze value was measured using a haze meter (product name "HM-150"; manufactured by Murakami Color Research Laboratory Co., Ltd.) in accordance with JIS K7136: 2000. The above-described haze value was defined as the arithmetic mean of three haze values, wherein the three haze values were obtained by cutting a piece of 50 mm×100 mm from one optical film and placing the piece of film without any curl or wrinkle and without any fingerprint or dirt, into the haze meter in such a manner that the inorganic layer side faced opposite to the light source to measure the haze value, and repeating the measurement three times.

<Total Light Transmittance>

The total light transmittance of the optical film according to each of Examples and Comparative Examples was measured. The total light transmittance was measured using a haze meter (product name "HM-150"; manufactured by Murakami Color Research Laboratory Co., Ltd.) in accordance with JIS K7361-1: 1997. The total light transmittance was defined as the arithmetic mean of three haze values, wherein the three haze values were obtained by cutting a piece of 50 mm×100 mm from one optical film and placing the piece of film without any curl or wrinkle and without any fingerprint or dirt, into the haze meter in such a manner that the inorganic layer side faced opposite to the light source to measure the haze value, and repeating the measurement three times.

<Foldability>

The optical film according to each of Examples and Comparative Examples was evaluated for foldability by carrying out a folding test on the optical film. Specifically, a piece having a size of 30 mm×100 mm was first cut out from the optical film and mounted to an endurance testing machine (product name "DLDMLH-FS"; manufactured by Yuasa System Co., Ltd.) by fixing the short edges of the optical film piece to fixing members, as shown in FIG. 3(C), in such a manner that the minimum distance between the two opposing edges was 6 mm, and the piece was tested by repeating the successive folding test (in which the piece was folded with the inorganic layer facing inward and with the polyimide base material facing outward) one hundred thousand times, in each of which the surface side of the optical film piece was folded inward at an angle of 180 degrees, to examine whether any crack or break was formed at the bent part. In the same manner, a new piece having a size of 30 mm×100 mm was cut out from the optical film and mounted to an endurance testing machine (product name "DLDMLH-FS"; manufactured by Yuasa System Co., Ltd.) by fixing the short edges of the optical film piece to fixing members, in such a manner that the minimum distance between the two opposing edges was 2 mm, and the piece was tested by repeating the successive folding test (in which the piece was folded with the inorganic layer facing inward and with the polyimide base material facing outward) one hundred thousand times, in each of which the surface side of the optical film piece was folded inward at an angle of 180 degrees, to examine whether any crack or break was formed at the bent part. The evaluation criteria were as below-mentioned.

(Foldability)
  ○: no crack or break was formed at the bent part in the folding tests.
  x: a crack(s) or a break(s) was/were formed at the bent part in the folding tests.
<Interference Fringe Evaluation>
The optical film according to each of Examples and Comparative Examples was evaluated for interference fringe. Specifically, a piece having a size of 50 mm×100 mm was cut out from the optical film, and to the back surface of the optical film piece, a black acrylic plate for preventing back surface reflection was attached via a transparent adhesive having a thickness of 25 μm (product name "Optically Clear Adhesive 8146-1"; manufactured by 3M Company). The surface side of the optical film was exposed to light and checked for any interference fringe by visual observation. The light source used was a three-wavelength tube fluorescent lamp. The generation of interference fringe was rated on the basis of the following criteria.
  ○: no interference fringe was found.
  Δ: slight interference fringe was found.
  x: some interference fringe was clearly found.

TABLE 1

| | HC Film Thickness (μm) | Indentation Hardness (MPa) | Metallic Element and Metalloid Element present or not | Metallic Element and Metalloid Element Atomic Ratio (%) | Area Ratio of Silica Particle (%) | Scratch Resistance |
|---|---|---|---|---|---|---|
| Example 1 | 4 | 587 | yes | 18.2 | 50 | ○ |
| Example 2 | 4 | 1010 | yes | 25.1 | 67 | ○ |
| Example 3 | 4 | 228 | yes | 3.2 | 6 | ○ |
| Example 4 | 4 | 485 | yes | 16.4 | 51 | ○ |
| Example 5 | 1.2 | 574 | yes | 17.6 | 50 | ○ |
| Example 6 | 10 | 591 | yes | 17.2 | 50 | ○ |
| Example 7 | 20 | 592 | yes | 17.3 | 51 | ○ |
| Example 8 | 4 | 588 | yes | 17 | 50 | ○ |
| Example 9 | 4 | 589 | yes | 16.8 | 50 | ○ |
| Example 10 | 4 | 452 | yes | 6.8 | — | ○ |
| Comparative Example 1 | 4 | 320 | no | 0 | 0 | x |
| Comparative Example 2 | 4 | 125 | yes | 1 | 7 | x |
| Comparative Example 3 | 0.8 | 572 | yes | 2.8 | 50 | x |

TABLE 2

| | Haze Value (%) | Total Light Transmittance (%) | Foldability 6 mm | Foldability 2 mm | Interference Fringe |
|---|---|---|---|---|---|
| Example 1 | 0.8 | 90.8 | ○ | ○ | Δ |
| Example 2 | 0.7 | 90.7 | ○ | ○ | Δ |
| Example 3 | 0.8 | 90.7 | ○ | ○ | Δ |
| Example 4 | 0.9 | 90.6 | ○ | ○ | Δ |
| Example 5 | 0.8 | 90.8 | ○ | ○ | Δ |
| Example 6 | 0.8 | 90.8 | ○ | ○ | Δ |
| Example 7 | 0.8 | 90.8 | ○ | x | ○ |
| Example 8 | 0.7 | 90.8 | ○ | ○ | ○ |
| Example 9 | 0.6 | 91.2 | ○ | ○ | ○ |
| Example 10 | 0.4 | 91.1 | ○ | ○ | ○ |
| Comparative Example 1 | 0.7 | 91.1 | ○ | ○ | Δ |
| Comparative Example 2 | 0.6 | 91.0 | ○ | ○ | Δ |
| Comparative Example 3 | 0.7 | 90.8 | ○ | ○ | x |

The results will be described below. As shown in Table 1, the hard coat layer of the optical film according to Comparative Example 1 contained no inorganic particles, or did not contain at least one of a metallic element and a metalloid element, and thus, the surface of the inorganic layer was found to have low scratch resistance. The optical film according to Comparative Example 2 had an indentation hardness of less than 200 MPa, and thus, the surface of the inorganic layer was found to have low scratch resistance. The hard coat layer of the optical film according to Comparative Example 3 had a small film thickness, and thus, the surface of the inorganic layer was found to have low scratch resistance. In contrast, the hard coat layer of the optical film according to Examples 1 to 10 contained inorganic particles or at least one of a metallic element and a metalloid element, the optical film had an indentation hardness of 200 MPa or more, and the hard coat layer had a film thickness of 2 μm or more. Thus, the surface of the inorganic layer was found to have excellent scratch resistance. In this regard, a steel wool test was carried out on the optical film according to each of Examples 1 to 6 and 8 to 10 under the same conditions as above-described after the above-described folding test. Then, the surface of the optical film was checked for any scratch and chip by visual observation, and the optical films were found to have no scratch or chip, or have a few scratches or chips but at a level which was not problematic for practical usage.

The hard coat layer of the optical film according to each of Examples 1 to 6 and 8 to 10 had a film thickness 10 μm or less, and thus, the optical film had better foldability than the optical film according to Example 7 in which the hard coat layer had a film thickness of 20 μm.

The hard coat layer of the optical film according to Example 7 was quite thick, the optical film according to Example 8 had an optical adjustment layer formed therein, and the optical film according to Example 9 had a polyimide base material having low refractive index. Thus, none of these optical films were found to exhibit interference fringe.

The inorganic layer of the optical film according to each of Examples was checked for any silicon using an X-ray photoelectron spectroscope (product name "KRATOS Nova"; manufactured by Shimadzu Corporation), and all the optical films were found to have silicon present in the inorganic layer. To check whether the inorganic layer had silicon present therein, the surface of the inorganic layer of an optical film cut to a size of 1 mm×6 mm was subjected to elemental analysis using an X-ray photoelectron spectroscope (ESCA, product name "KRATOS Nova"; manufactured by Shimadzu Corporation) under the same measurement conditions as a check was made on whether the hard coat layer had a metallic element and a metalloid element present therein.

LIST OF REFERENCE NUMERALS 10, 50: Optical film
11: Light-transmitting base material
12, 51: Hard coat layer
12A: Binder resin
12B: Inorganic particles
13: Inorganic layer
40, 60: Image display device
43: Display panel
51A: Silicone resin
51B: Inorganic particles

The invention claimed is:

1. An optical film comprising a light-transmitting base material, a hard coat layer, and an inorganic layer in this order,
    wherein the hard coat layer is in contact with the inorganic layer,
    the hard coat layer contains a binder resin and inorganic particles,
    the hard coat layer is a single-layer structure,
    the hard coat layer has a film thickness of 1 μm or more and 10 μm or less,
    the hard coat layer has an indentation hardness of 200 MPa or more, and
    the inorganic particles have an area ratio of 5% or more in the region up to a depth of 500 nm into the hard coat layer from the interface between the hard coat layer and the inorganic layer in the cross-section of the hard coat layer in the film thickness direction.

2. The optical film according to claim 1, wherein the inorganic particles have an area ratio of 5% or more and 75% or less in the region up to a depth of 500 nm into the hard coat layer from the interface between the hard coat layer and the inorganic layer in the cross-section of the hard coat layer in the film thickness direction.

3. The optical film according to claim 1, wherein the inorganic particles are silica particles.

4. The optical film according to claim 1, wherein the inorganic layer is an inorganic oxide layer.

5. The optical film according to claim 1, wherein the inorganic layer contains silicon.

6. The optical film according to claim 1, wherein the inorganic layer has a thickness of 10 nm or more and 300 nm or less.

7. The optical film according to claim 1, wherein the hard coat layer contains a polymer of a polymerizable compound containing a silsesquioxane having a polymerizable functional group.

8. The optical film according to claim 1, wherein no crack or break is formed in the optical film after folding the optical film at an angle of 180 degrees in a manner that leaves a gap of 6 mm between the opposite edges, unfolding the folded optical film, and repeating the process one hundred thousand times.

9. The optical film according to claim 1, wherein no crack or break is formed in the optical film after folding the optical film with the inorganic layer facing inward at an angle of 180 degrees in a manner that leaves a gap of 2 mm between the opposite edges, unfolding the folded optical film, and repeating the process one hundred thousand times.

10. The optical film according to claim 1, wherein the light-transmitting base material is composed of a polyimide resin, a polyamide resin, or a combination thereof.

11. An image display device comprising
    a display panel and
    the optical film according to claim 1 placed on the observer's side of the display panel,
    wherein the hard coat layer of the optical film is placed on the observer's side of the light-transmitting base material.

12. The image display device according to claim 11, wherein the display panel is an organic light emitting diode panel.

13. An optical film comprising a light-transmitting base material, a hard coat layer, and an inorganic layer in this order,
    wherein the hard coat layer is in contact with the inorganic layer,
    the hard coat layer contains at least one of a metallic element and a metalloid element,
    the hard coat layer is a single-layer structure,
    the hard coat layer has a film thickness of 1 μm or more and 10 μm or less,
    the hard coat layer has an indentation hardness of 200 MPa or more,
    the hard coat layer contains inorganic particles, and
    the inorganic particles have an area ratio of 5% or more in the region up to a depth of 500 nm into the hard coat layer from the interface between the hard coat layer and the inorganic layer in the cross-section of the hard coat layer in the film thickness direction.

14. The optical film according to claim 13, wherein the hard coat layer contains a metalloid element, and the metalloid element is silicon.

15. The optical film according to claim 13, wherein the atomic ratio of the total of the metallic element and the metalloid element contained in the hard coat layer is 1.5% or more and 30% or less as measured by X-ray photoelectron spectroscopy.

16. The optical film according to claim 13, wherein the inorganic layer is an inorganic oxide layer.

17. The optical film according to claim 13, wherein the inorganic layer contains silicon.

18. The optical film according to claim 13, wherein the inorganic layer has a thickness of 10 nm or more and 300 nm or less.

19. The optical film according to claim 13, wherein the hard coat layer contains a polymer of a polymerizable compound containing a silsesquioxane having a polymerizable functional group.

20. The optical film according to claim 13, wherein no crack or break is formed in the optical film after folding the optical film at an angle of 180 degrees in a manner that leaves a gap of 6 mm between the opposite edges, unfolding the folded optical film, and repeating the process one hundred thousand times.

21. The optical film according to claim 13, wherein no crack or break is formed in the optical film after folding the optical film with the inorganic layer facing inward at an angle of 180 degrees in a manner that leaves a gap of 2 mm between the opposite edges, unfolding the folded optical film, and repeating the process one hundred thousand times.

22. The optical film according to claim 13, wherein the light-transmitting base material is composed of a polyimide resin, a polyamide resin, or a combination thereof.

23. An image display device comprising
a display panel and
the optical film according to claim 13 placed on the observer's side of the display panel,
wherein the hard coat layer of the optical film is placed on the observer's side of the light-transmitting base material.

24. The image display device according to claim 23, wherein the display panel is an organic light emitting diode panel.

* * * * *